United States Patent
Otake et al.

(10) Patent No.: US 8,803,526 B2
(45) Date of Patent: Aug. 12, 2014

(54) BALUN AND MAGNETIC RESONANCE IMAGING APPARATUS

(75) Inventors: Yosuke Otake, Mitaka (JP); Yoshihisa Soutome, Tokyo (JP); Yukio Kaneko, Kawaguchi (JP); Yoshitaka Bito, Kokubunji (JP); Hisaaki Ochi, Kodaira (JP); Koji Hirata, Kasukabe (JP)

(73) Assignee: Hitachi, Ltd., Tokyo (JP)

( * ) Notice: Subject to any disclaimer, the term of this patent is extended or adjusted under 35 U.S.C. 154(b) by 468 days.

(21) Appl. No.: 13/142,439

(22) PCT Filed: Jan. 28, 2010

(86) PCT No.: PCT/JP2010/051144
§ 371 (c)(1),
(2), (4) Date: Jun. 28, 2011

(87) PCT Pub. No.: WO2010/090129
PCT Pub. Date: Aug. 12, 2010

(65) Prior Publication Data
US 2011/0267062 A1 Nov. 3, 2011

(30) Foreign Application Priority Data
Feb. 4, 2009 (JP) ................................. 2009-023491

(51) Int. Cl.
*G01V 3/00* (2006.01)
(52) U.S. Cl.
USPC .......................................... 324/322; 324/318
(58) Field of Classification Search
USPC .................. 324/322, 318, 314, 309, 307, 300
See application file for complete search history.

(56) References Cited

U.S. PATENT DOCUMENTS

| 4,682,125 A * | 7/1987 | Harrison et al. ................ 333/12 |
| 5,376,885 A * | 12/1994 | Arakawa et al. ............. 324/322 |
| 6,320,385 B1 * | 11/2001 | Burl et al. ..................... 324/322 |
| 7,733,092 B2 * | 6/2010 | Otake et al. ................... 324/322 |
| 2008/0297154 A1 | 12/2008 | Otake et al. |
| 2009/0021261 A1 | 1/2009 | Chmielewski et al. |

FOREIGN PATENT DOCUMENTS

| JP | 2008-295737 A | 12/2008 |
| WO | 2005/069028 A1 | 7/2005 |

OTHER PUBLICATIONS

Mispelter et al., NMR Probe Heads for Biophysical and Biomedical Experiments, Imperial College Press, London, 2006, pp. 120-128, ISBN: 1-86094-637-2.
P. Sipila et al., A magnetic field monitoring add-on toolkit based on transmit-receive NMR probes, Proc. Interl. Soc. Mag. Reson. Med., 2008, p. 680.

* cited by examiner

*Primary Examiner* — Louis Arana
(74) *Attorney, Agent, or Firm* — Mattingly & Malur, PC

(57) ABSTRACT

The present invention provides a technique for maintaining a function for effectively blocking common mode noise with a simple configuration, even in the case where unbalance occurs in characteristic impedance of a coaxial cable in an MRI apparatus, and improving the performance of an RF coil. In a circuit where a balun is established by parallel connection with the coaxial cable, multiple serial resonance circuits having different resonance frequencies are connected in parallel. A value of each constitutional element of each of the serial resonance circuits is adjusted in such a manner that the frequency for blocking the common mode noise of the entire balun falls into a range between the resonance frequencies of these serial resonance circuits.

14 Claims, 12 Drawing Sheets

500(118)

501(118)

118A

118B

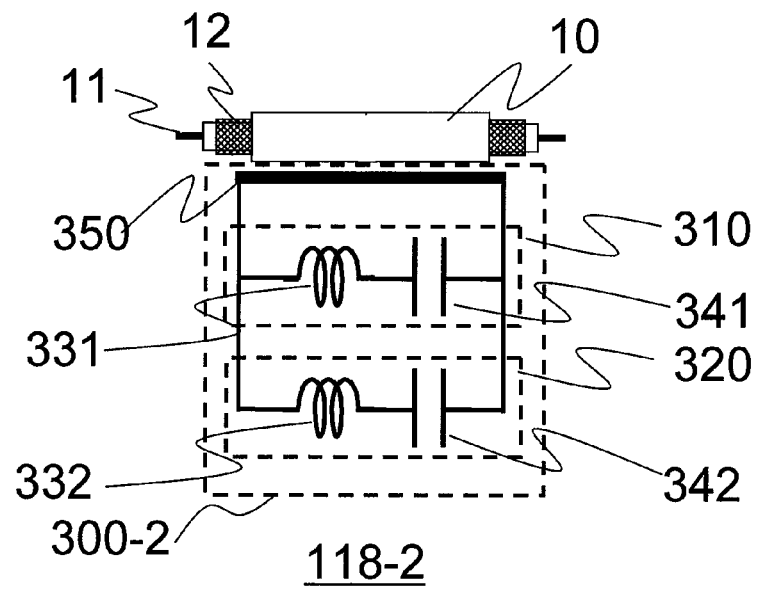
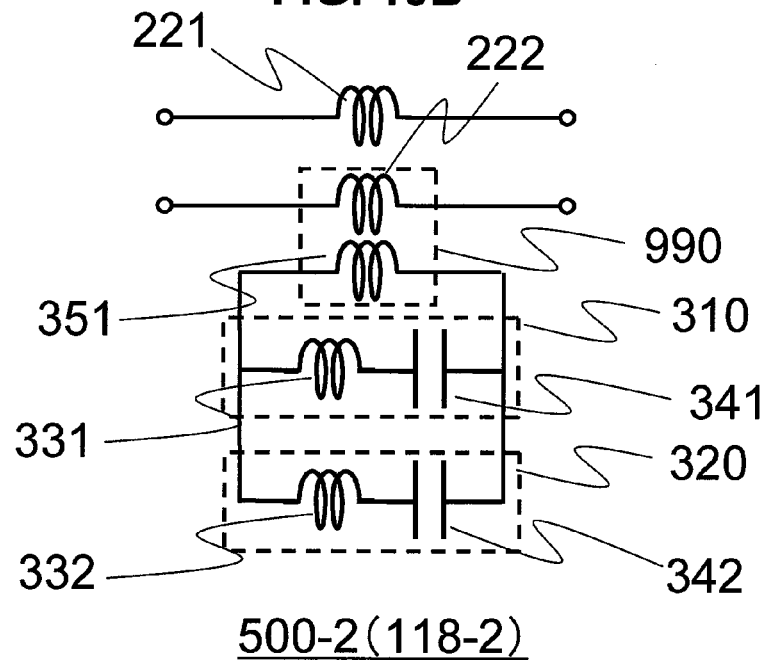

BALUN AND MAGNETIC RESONANCE IMAGING APPARATUS

TECHNICAL FIELD

The present invention relates to a technique for enhancing performance of a magnetic resonance imaging (MRI) apparatus, and more particularly, it relates to a technique for blocking common mode noise.

BACKGROUND ART

The MRI apparatus is a medical image diagnostic system which excites magnetic resonance in atomic nuclei within a section crossing a test subject, and obtains a tomographic image of the cross section according to nuclear magnetic resonance signals being generated. The MRI apparatus firstly conveys power generated from a radio frequency (RF) power source, to a transmit RF coil. Next, by using the transmit RF coil, the radio frequency is irradiated to the test subject so that a nuclear magnetic resonance signal of a hydrogen nucleus ($^1$H) is generated. Next, the nuclear magnetic resonance signal thus generated is detected by a receive RF coil which is adhered to the test subject, and thereafter, a receiver acquires the signal. Finally, the signal being acquired is converted into an image and accordingly a tomographic image is obtained. In general, the RF power source and the transmit RF coil are connected via a coaxial cable, and the receiver and the receive RF coil are also connected via a coaxial cable (Hereinafter, the transmit RF coil and the receive RF coil are referred to as "RF coil" with no distinction). Therefore, in many cases, the RF coil, the coaxial cable, and the test subject are placed in such a manner as being close to one another.

The coaxial cable has a configuration that an inner conductor and a shield are arranged on an identical axis, placing an insulator (a dielectric) therebetween. Since the coaxial cable has a small signal loss and its shield is connected to a ground, it has an excellent electromagnetic shield property. Therefore, the coaxial cable is widely used as a connection cable for RF equipment such as the RF coil. However, if a large amount of power or extremely high frequency is treated, there may be cases where coupling occurs between the coaxial cable and the test subject or the like. In such a case, characteristic impedance of the coaxial cable may become uneven by location (hereinafter, such state is represented as "unbalance"). In this state, noise referred to as "common mode noise" may occur simultaneously reducing the shielding effect of the coaxial cable, and thus the cable may become susceptible to various noise.

The common mode noise represents unbalanced current which flows in aground line. In some cases, this noise may propagate through a floor or a ground surface, and come back after going along a large loop while picking up various types of noise. Therefore, equipment such as the RF coil, to which the coaxial cable is connected, is subjected to this noise. Furthermore, there may be an unexpected impact also on the coaxial cable itself, not only on the equipment being connected. If this kind of noise occur within the MRI apparatus, the coaxial cable may further become susceptible to coupling (specifically, electromagnetic radiation or electromagnetic induction), due to a structural reason. Consequently, performance of the RF coil to which the coaxial cable is connected may be degraded, and further deteriorating an image quality of the MRI. In some cases, unbalance of the characteristic impedance which occurs within the coaxial cable may cause generation of reflected electric power.

In order to the common mode noise, a balance-unbalance circuit referred to as "balun") is used (for example, see the patent document 1 and the non-patent document 1)

FIG. 12A shows a representative example of the balun used in the MRI apparatus, the balun being a type to be inserted in the coaxial cable. As shown in the figure, the balun 20 is provided with a coaxial cable 10 forming a loop, and a capacitor 31 (hereinafter, a value of the capacitor is assumed as "C") being connected in parallel with a shield 12 on both ends of the coaxial cable 10. FIG. 12B is a circuit diagram 21 showing the case where an inductance is represented by a lumped element (an inductor), the inductance of the coaxial cable 10 forming the loop of the balun 20 as shown in FIG. 12A. A center conductor 11 in the coaxial cable 10 forms the inductor 32 where the inductance is indicated as $L_S$, and the shield 12 forms the inductor 33 where the inductance is indicated as $L_G$. The inductor 33 and the capacitor 31 constitute a parallel resonance circuit 34 serially with respect to the shield 12 of the coaxial cable 10. Impedance (resistance) Z of the parallel resonance circuit 34 varies as shown in FIG. 12C depending on a frequency f of the voltage being applied. The frequency f which maximizes the impedance Z is referred to as a resonance frequency $f_{RC}$ of the parallel resonance circuit 34. In other words, in the case where noise (e.g., common mode noise) having the same frequency as the resonance frequency $f_{RC}$ of the parallel resonance circuit 34 flows in the shield 12, the highest impedance Z of the parallel resonance circuit may the noise in the most effective way.

The resonance frequency $f_{RC}$ of the parallel resonance circuit 34 of the balun 20 (hereinafter, referred to as resonance frequency of the balun 20) as shown in FIG. 12A and in FIG. 12B is decided by the formula (1). In general, the resonance frequency $f_{RC}$ being the frequency at which the balun the common mode noise is tuned to be a nuclear magnetic resonance frequency $f_0$ of a measured nuclear species (e.g., hydrogen atomic nucleus) in the MRI apparatus.

$$f_0 = f_{RC} = \frac{1}{2\pi\sqrt{L_G C}} \tag{1}$$

PRIOR ART DOCUMENT

Patent Document

[Patent Document 1]
Japanese Unexamined Patent Application Publication (Translation of PCT Application) No. 2007-517570

Non-Patent Document

[Non-Patent Document 1]
Mispelter et al., "NMR Probe Heads for Biophysical and Biomedical Experiments)", Imperial College Press, London, 2006, pp. 120-128, ISBN: 1-86094-637-2

SUMMARY OF THE INVENTION

Problem to be Solved by the Invention

At the time of measurement, unbalance is likely to occur in the characteristic impedance of the coaxial cable, depending on a positional relationship between the coaxial cable and the test subject. When there is such unbalance, variations may occur in a value of reactance of the coaxial cable 10 forming the balun 20. Equivalently, variations may occur in the inductance $L_G$ of the shield 12 of the coaxial cable 10 forming a loop. As a result, the resonance frequency $f_{RC}$ of the balun 20 shifts from the value $f_0$ which is tuned according to the formula (1), to a higher frequency or to a lower frequency. Due to the shift of the resonance frequency $f_{RC}$, impedance of the balun 20 is reduced at the nuclear magnetic resonance f of the measured nuclear species, and therefore, this may disable effective removal of the common mode noise at the frequency.

For this case, another method is conceivable, where multiple baluns 20 are connected in series on the coaxial cable 10 that establishes connection among equipment, thereby combining the impedance to the common mode noise. However, to increase the number of baluns 20 in the RF coil unit which has many channels may induce coupling between the baluns 20, deteriorate performance of the balun 20, and further degrade the performance of the RF coil. In addition, the increase of the number of baluns 20 may occupy the space widely, and further increase a weight and cost of overall unit including the RF coil.

The present invention has been made considering the situation above, and it provides a technique which employs a simple configuration to maintain a function for effectively blocking the common mode noise, and improve the performance of the RF coil, even when unbalance occurs in the characteristic impedance of the coaxial cable in the MRI apparatus.

Means to solve the Problem

The present invention is directed to a circuit constituting a balun by establishing parallel connection with a coaxial cable, in which multiple serial resonance circuits having different resonance frequencies are connected in parallel, and a value of each constitutional element in each of the serial resonance circuits is adjusted in such a manner that a frequency of the balun for blocking common mode noise falls into a range between the resonance frequencies of those serial resonance circuits.

Specifically, a balun for blocking common mode noise flowing in a coaxial cable is provided, the balun including a part of the coaxial cable and a parallel circuit connected in parallel with a shield of the part of the coaxial cable, the parallel circuit including multiple serial resonance circuits each connected in parallel, and each of the multiple serial resonance circuits including a capacitor and an inductor being connected in series, wherein, resonance frequencies of the respective circuits are adjustable by capacitance of the capacitor and by inductance of the inductor, and at least one of the resonance frequencies of the multiple serial resonance circuits is adjusted to be lower than a frequency at which the balun the common mode noise, and at least one of the resonance frequencies is adjusted to be higher than the frequency at which the balun the common mode noise.

Furthermore, a magnetic resonance imaging apparatus is provided, including a static magnetic field forming means for forming a static magnetic field, a gradient magnetic field forming means for forming a gradient magnetic field, an RF magnetic field forming means for forming an RF magnetic field, a transmit coil for applying the RF magnetic field to a test subject, a receive coil for receiving a magnetic resonance signal from the test subject, a signal processing means for processing the magnetic resonance signal received by the receive coil, and a control means for controlling the gradient magnetic field forming means, the RF magnetic field forming means, and the signal processing means, wherein, the magnetic resonance imaging apparatus further includes, a first coaxial cable for transmitting the RF magnetic field formed by the RF magnetic field forming means to the transmit coil, and a second coaxial cable for transmitting the magnetic resonance signal received by the receive coil to the signal processing means, each of the first coaxial cable and the second coaxial cable is provided with a balun, and the balun for blocking common mode noise flowing in the coaxial cables incorporates a part of the coaxial cable and a parallel circuit being connected in parallel with a shield of the part of the coaxial cable, the parallel circuit is provided with multiple serial resonance circuits each connected in parallel, each of the multiple serial resonance circuits is provided with a capacitor and an inductor being serially connected, resonance frequencies of the respective circuits are adjustable by capacitance of the capacitor and by inductance of the inductor, at least one of the resonance frequencies of the multiple serial resonance circuits is adjusted to be lower than a frequency at which the balun s the common mode noise, and at least one of the resonance frequencies is adjusted to be higher than the frequency at which the balun s the common mode noise, and the balun is connected with each of the first coaxial cable and the second coaxial cable.

Effect of the Invention

According to the present invention, a function for effectively blocking the common mode noise is maintained in a simple configuration and the performance of the RF coil is improved, even when unbalance occurs in the characteristic impedance of the coaxial cable in the MRI apparatus.

BRIEF DESCRIPTION OF DRAWINGS

FIG. 10A is a schematic block diagram of the balun according to the second embodiment;

FIG. 10B is a circuit diagram of the balun according to the second embodiment;

PREFERRED EMBODIMENTS OF THE INVENTION

First Embodiment

Hereinafter, a first embodiment to which the present invention is applied will be explained. In the following descriptions, elements having the same function are labeled the same in all the figures for explaining the embodiments of the present invention, and tedious explanations will not be made.

Figure 1A:
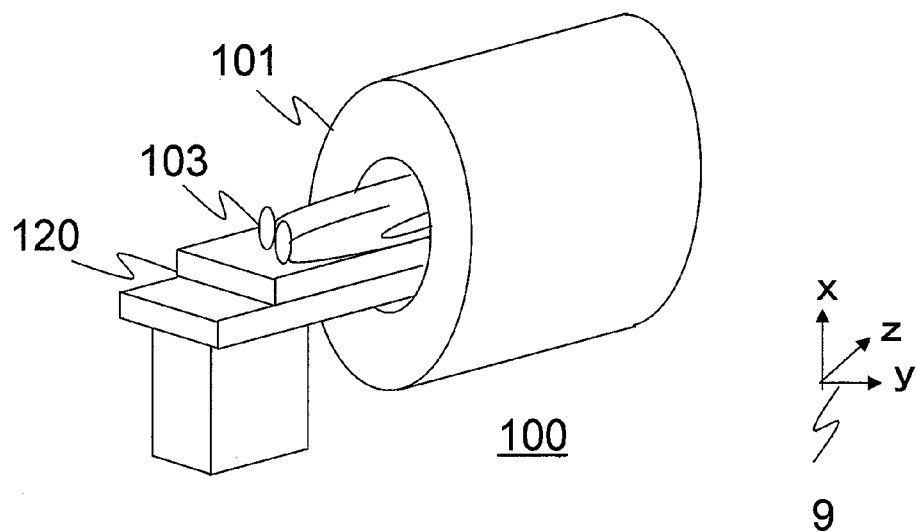
FIG. 1A is an overview of an MRI apparatus of a horizontal magnetic field system according to the first embodiment.
Figure 1B:
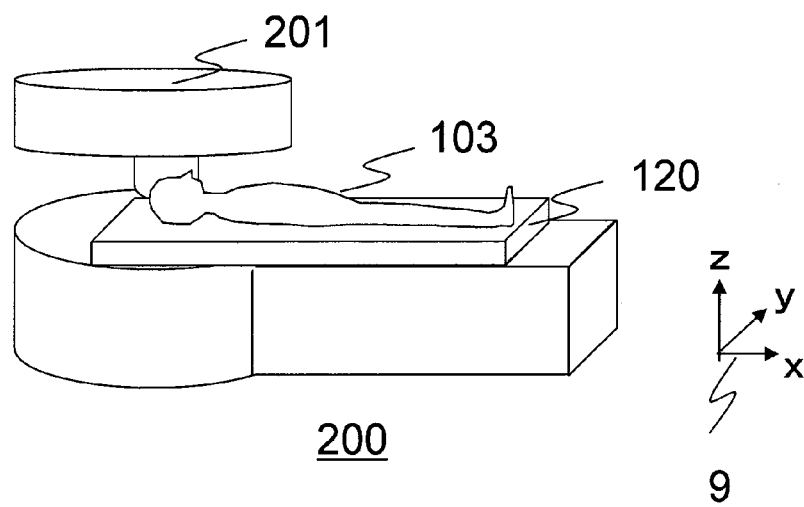
FIG. 1B is an overviews of an MRI apparatus of a vertical magnetic field system according to the first embodiment.

An explanation will be made as to the overall configuration of the MRI apparatus according to the present embodiment. FIG. 1 illustrates overviews of the MRI apparatus according to the first embodiment. In the figure, the z-axis direction of the coordinate 9 indicates a static magnetic field direction. The MRI apparatus 100 shown in FIG. 1A is provided with a magnet 101 of the horizontal magnetic field system. The MRI apparatus 200 shown in FIG. 1B is provided with a magnet 201 of the vertical magnetic field system. Each of the MRI apparatuses 100 and 200 is provided with a table 120 for placing a test subject 103 thereon. The present embodiment is applicable to any of the MRI apparatus 100 provided with the magnet 101 of the horizontal magnetic field system and the MRI apparatus 200 provided with the magnet 101 of the vertical magnetic field system. Hereinafter, an explanation will be made taking as an example, the MRI apparatus 100 having the magnet 101 of the horizontal magnetic field system.

Figure 2A:
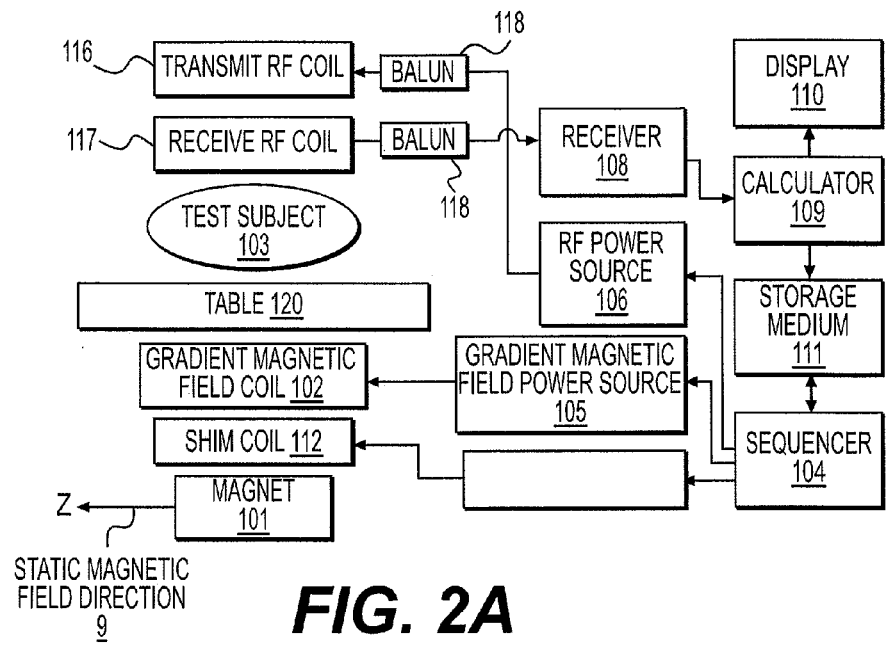
FIG. 2A is a block diagram of the configuration where a transmit RF coil and a receive RF coil are separately provided according to the first embodiment.

FIG. 2 illustrates block diagrams of schematic configurations of the MRI apparatus 100. FIG. 2A is a block diagram showing the case where the transmit RF coil for irradiating an RF magnetic field and the receive RF coil for receiving a nuclear magnetic resonance signal are separately provided. As illustrated in the figure, the MRI apparatus 100 is provided with the magnet 101 of the horizontal magnetic field system, a gradient magnetic field coil 102 for generating a gradient magnetic field, a sequencer 104, a transmit RF coil 116 for irradiating the test subject 103 with an RF magnetic field, the receive RF coil 117 for detecting the nuclear magnetic resonance signal generated from the test subject 103, and a balun 118 for blocking common mode noise. The gradient magnetic field coil 102 is connected to a gradient magnetic field power source 105. The transmit RF coil 116 is connected to an RF power source 106 via the balun 118. The receive RF coil 117 is connected to the receiver 108 via the balun 118. The sequencer 104 sends a command to the gradient magnetic field power source 105 and the RF power source 106, thereby generating the gradient magnetic field and the RF magnetic field, respectively. The RF signal generated from the RF power source 106 is applied to the test subject 103 in the form of the RF magnetic field, via the transmit RF coil 116. By applying the RF magnetic field, the receive RF coil 117 detects the magnetic resonance signal generated from the test subject 103, the receiver 108 performs detection thereof, then being subjected to A/D conversion, and the signal is transmitted to the calculator 109. The sequencer 104 sets a magnetic resonance frequency that is used as a standard of the detection by the receiver 108. Thereafter, the signal is subjected to signal processing such as image reconstruction by the calculator 109. A result thereof is displayed as an image on the display 110. Detected signals and measurement conditions are stored in a storage medium 111 as appropriate. The sequencer 104 controls operations of each of the units described above in such a manner that the gradient magnetic field and the RF magnetic field are generated at the timing and at the intensity as programmed in advance.

Figure 2B:
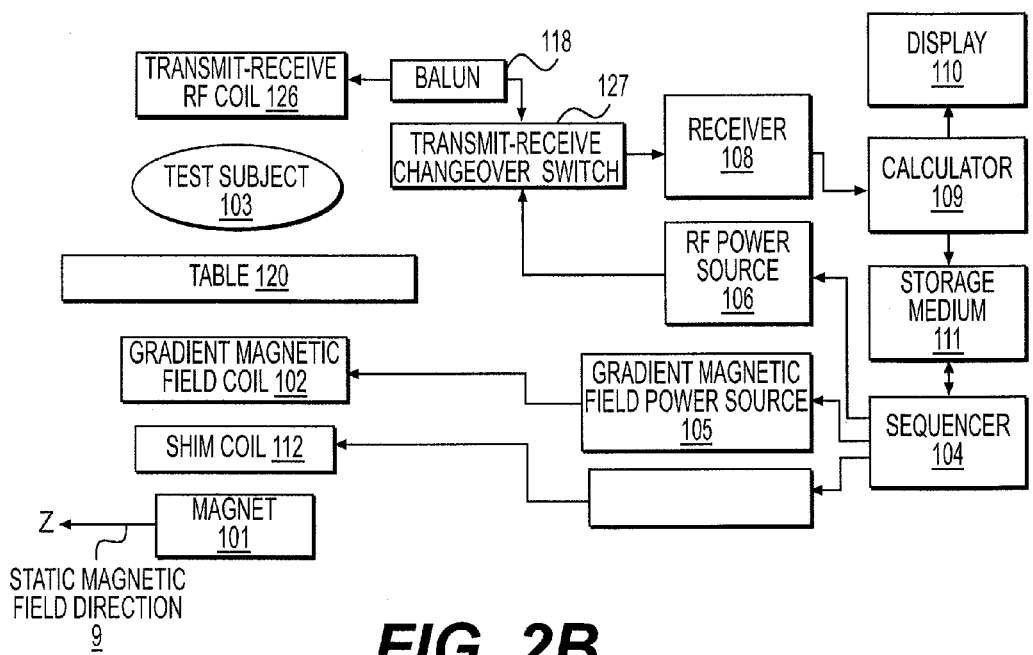
FIG. 2B is a block diagram of the configuration where an RF coil used for both transmitting and receiving is provided according to the first embodiment.

When it is necessary to adjust homogeneity of the static magnetic field, a shim coil 112 is utilized. It is to be noted that as shown in FIG. 2B, one transmit-receive RF coil 126 may serve as both the transmit RF coil 116 and the receive RF coil 117. For this case, the transmit-receive RF coil is connected to each of the RF power source 106 and the receiver 108 via a transmit-receive changeover switch 127 which temporally switches between transmitting and receiving. As for the present embodiment described below, an explanation will be made taking as an example, the transmit RF coil 116 for generating the RF magnetic field and the receive RF coil 117 for receiving a signal from the test subject 103 are provided separately. It is to be noted that in the following description, if there is no need of distinguishing between the transmit RF coil 116 and the receive RF coil 117, those coils are represented by "RF coil".

In the MRI apparatus 100 of the present embodiment, the transmit RF coil 116 and the RF power source 106 are connected via the coaxial cable 10, and the receive RF coil 117 and the receiver 108 are also connected via the coaxial cable 10. The balun 118 is formed using a part of the coaxial cable 10 as its partial configuration.

According to the present embodiment, the balun 118 is configured so that it enables a provision of high impedance for common mode noise having a nuclear resonance frequency $f_0$ of the test subject, even in the case where unbalance occurs in the characteristic impedance of the coaxial cable 10 which is connected to the balun 118 or which forms the balun 118.

Figure 3:
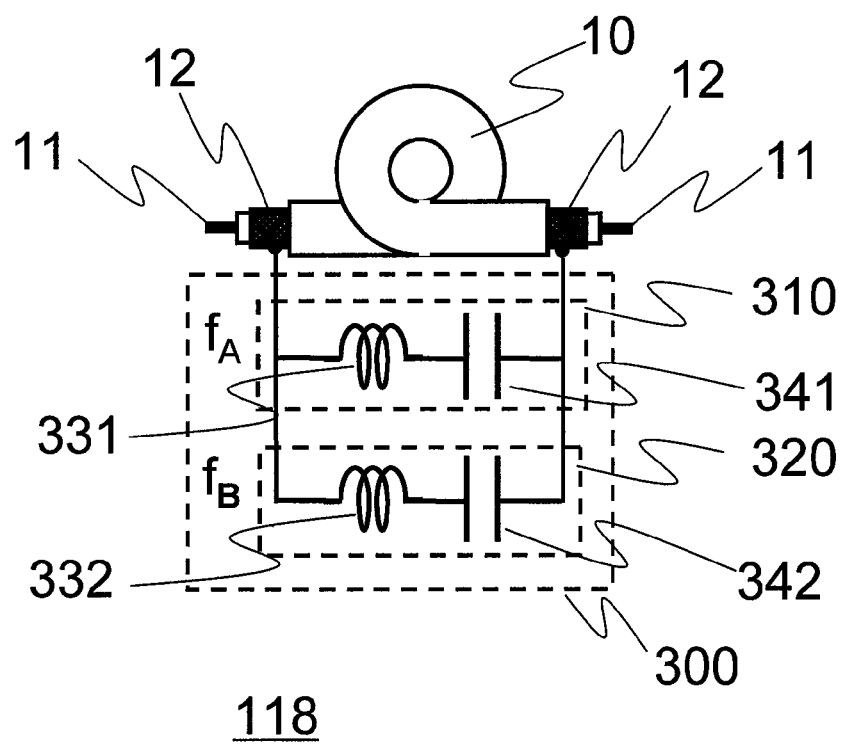
FIG. 3 is a schematic block diagram of a balun according to the first embodiment.

Firstly, a configuration of the balun 118 of the present embodiment will be explained. FIG. 3 is a schematic block diagram of the balun 118 using the coaxial cable 10 of the present embodiment. The balun 118 of the present embodiment has a configuration that a balun formation circuit 300 is connected in parallel with the shields 12 on both ends of the coaxial cable 10 which forms a loop shape. The balun formation circuit 300 incorporates a first serial resonance circuit 310 and a second serial resonance circuit 320, which are connected in parallel. The first serial resonance circuit 310 is provided with an inductor 331 and a capacitor 341 being connected in series, and the second serial resonance circuit 320 is provided with an inductor 332 and a capacitor 342 being connected in series.

In addition, as mentioned above, a part of the coaxial cable 10 constituting the balun 118 of the present embodiment extends the coaxial cable 10 and establishes connection between the RF power source 106 and the transmit RF coil 116, and between the receiver 108 and the receive RF coil 117. Therefore, both ends of the coaxial cable 10 constituting the balun 118 are respectively connected to the RF power source 106 and the transmit RF coil 116 via the coaxial cable 10, or respectively connected to the receiver 108 and the receive RF coil 117 via the coaxial cable 10.

Here, inductance of the inductor 331 and inductance of the inductor 332 are expressed as $L_A$ and $L_B$, respectively, capacitance of the capacitor 341 and capacitance of the capacitor 342 are expressed as $C_A$ and $C_B$, respectively, and the resonance frequency of the first serial resonance circuit 310 and the resonance frequency of the second serial resonance circuit 320 are expressed as $f_A$ and $f_B$, respectively.

In the balun 118 of the present embodiment, the nuclear magnetic resonance frequency $f_0$ of the measured nuclear species, and the resonance frequencies $f_A$ and $f_B$ of the respective serial resonance circuit 310 and 320, are adjusted so that they satisfy the following formula (2).

$$f_A < f_0 < f_B \tag{2}$$

The resonance frequencies $f_A$ and $f_B$ of the respective resonance circuits 310 and 320 are adjusted, by adjusting the inductance $L_A$, capacitance $C_A$, inductance $L_B$, and capacitance $C_B$, respectively of the inductor 331, capacitor 341, inductor 332, and capacitor 342, which constitute each of the serial resonance circuits.

Hereinafter, an explanation will be made as to the case where the balun 118 is able to obtain high impedance at the nuclear magnetic resonance frequency $f_0$ of the measured nuclear species, when the resonance frequencies $f_A$ and $f_B$ of the respective serial resonance circuits 310 and 320 are adjusted so as to satisfy the formula (2) above.

Before explaining the operation of the balun 118 of the present embodiment that has the configuration above, an explanation will be made as to a structure of the coaxial cable 10 and an operation of a general serial resonance circuit.

Figure 4A:
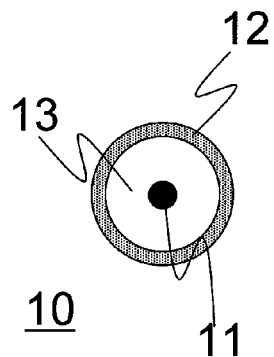
FIG. 4A is an illustration for explaining a structure of the coaxial cable according to the first embodiment.
Figure 4B:
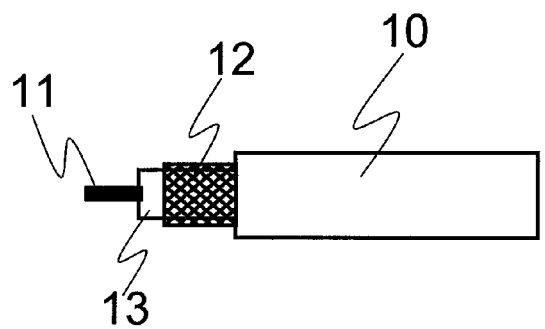
FIG. 4B is an illustration for explaining a structure of the coaxial cable according to the first embodiment.
Figure 12A:
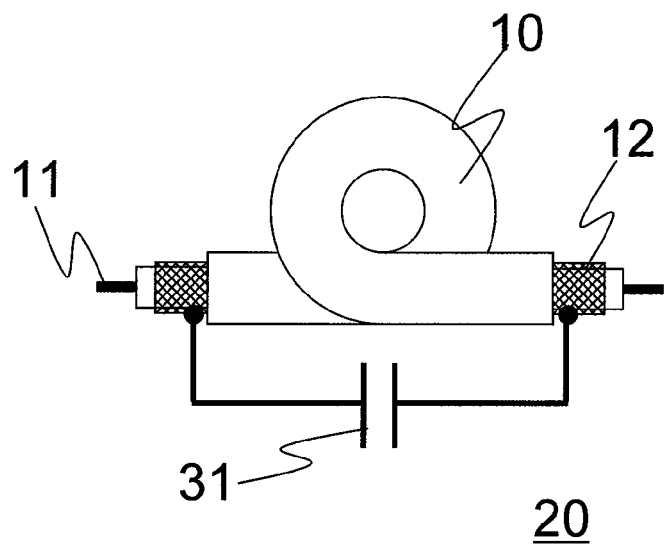
FIG. 12A illustrates a configuration of a conventional balun.
Figure 12B:
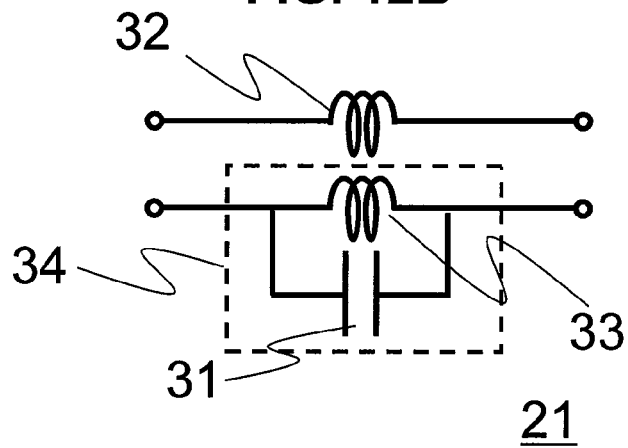
FIG. 12B is a circuit diagram of the conventional balun.
Figure 12C:
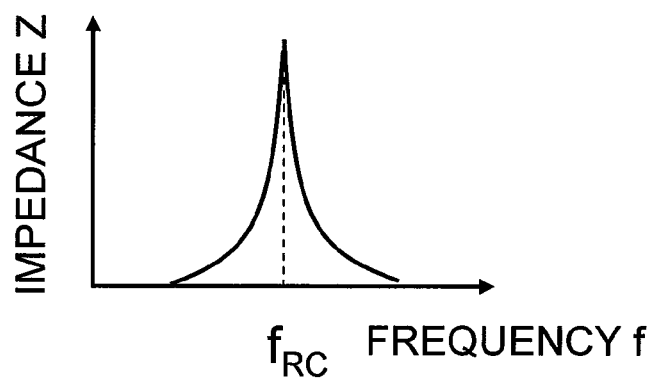
FIG. 12C illustrates a frequency characteristic of impedance of the conventional balun.

Firstly, the structure of the coaxial cable 10 will be explained. FIG. 4A and FIG. 4B are illustrations for explaining the structure of the coaxial cable 10. The coaxial cable 10 of the present embodiment has the same structure as the general coaxial cable explained with reference to FIG. 12A and FIG. 12B, and it is an RF transmission cable provided with characteristic impedance. Here, the elements having the same functions as shown in FIG. 12A and FIG. 12B are labeled the same. As illustrated in FIG. 4A and FIG. 4B, the coaxial cable 10 has a structure arranging a center conductor 11 and a shield 12 on the same axis, placing an insulator (dielectric) 13 therebetween. When the coaxial cable 10 is used, the shield 12 is grounded, and thereby shows a superior shielding property.

Figure 4C:
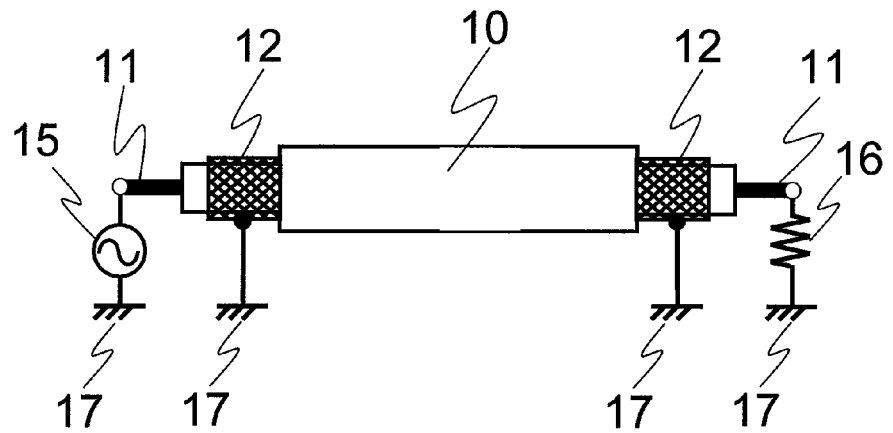
FIG. 4C is an illustration for explaining a configuration at the point of use according to the first embodiment.

Next, a configuration of the coaxial cable 10 will be explained, when it is put into general use. FIG. 4C is an illustration for explaining a configuration of the coaxial cable 10 when it is commonly used. As shown in FIG. 4C, a signal source 15 and a load 16 are connected respectively to both ends of the center conductor 11 of the coaxial cable 10. The other end of the signal source 15 and the other end of the load 16 are connected to the ground 17. The shield 12 of the coaxial cable 10 is also connected to the ground 17.

Figure 5A:
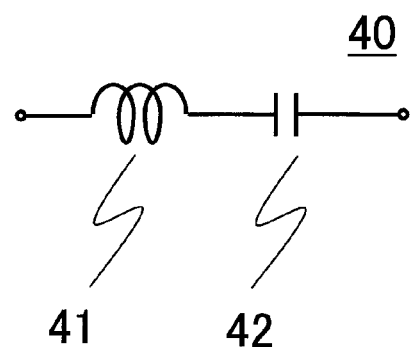
FIG. 5A is an equivalent circuit diagram for explaining an operation of a general serial resonance circuit.
Figure 5B:
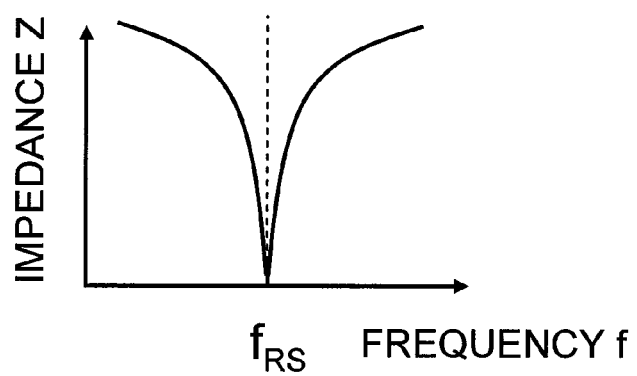
FIG. 5B illustrates a frequency characteristic of impedance for explaining an operation of a general serial resonance circuit.

Next, an operation of a general serial resonant circuit will be explained. FIG. 5A and FIG. 5B are illustrations for explaining the operation of a general serial resonance circuit 40. As shown in FIG. 5A, the serial resonance circuit 40 is formed so that the inductor 40 of the inductance is L and the capacitor 42 of the capacitance is C are serially connected. When a frequency and an angular frequency of the voltage applied to this serial resonance circuit 40 are assumed as f and ω (ω=2πf) respectively, impedance Z on both ends of the serial resonance circuit 40 is expressed by the following formula (3):

$$Z = j\omega L + \frac{1}{j\omega C} = j2\pi f L + \frac{1}{j2\pi f C} \tag{3}$$

FIG. 5B is an illustration for explaining a frequency characteristic of the serial resonance circuit 40. The impedance Z of the serial resonance circuit 40 varies depending on the frequency f as shown in FIG. 5B. As illustrated in this figure, when the resonance frequency of the serial resonance circuit is assumed as $f_{RS}$, the impedance Z of the serial resonance circuit 40 becomes zero at frequency $f=f_{RS}$, and the serial resonance circuit 40 establishes resonance.

In addition, the serial resonance circuit 40 operates as an inductive reactance in the frequency domain higher than the resonance frequency $f_{RS}$ ($f_{RS}<f$). The impedance Z at this timing is expressed by the following formula (4).

$$Z = j2\pi f L \frac{(f/f_{RS})^2 - 1}{(f/f_{RS})^2} \tag{4}$$

In addition, an apparent inductance L' of the serial resonance circuit 40 at this timing is expressed by the following formula (5).

$$L' = \frac{(f/f_{RS})^2 - 1}{(f/f_{RS})^2} L \tag{5}$$

On the other hand, the serial resonance circuit 40 operates as a capacitive reactance in the frequency domain lower than the resonance frequency $f_{RS}$ ($f<f_{RS}$). The impedance Z at this timing is expressed by the following formula (6).

$$Z = \frac{1 - (f/f_{RS})^2}{j2\pi f C} \tag{6}$$

An apparent capacitance C' of the serial resonance circuit 40 at this timing is expressed by the following formula (7).

$$C' = \frac{C}{1 - (f/f_{RS})^2} \tag{7}$$

As described above, the serial resonance circuit 40 operates in a different manner assuming the resonance frequency $f_{RS}$ as a threshold, depending on the frequency f of the voltage to be applied. In other words, when the frequency f of the voltage to be applied is higher than the resonance frequency $f_{RS}$, the serial resonance circuit 40 operates as the inductive reactance, and when it is lower than the resonance frequency $f_{RS}$, the serial resonance circuit 40 operates as the capacitive reactance.

Considering the structure of the coaxial cable 10 and the operation of the general serial resonance circuit 40, an operation and a characteristic of the balun 118 of the present embodiment will be explained with reference to FIG. 6. It is assumed here that the resonance frequencies $f_A$ and $f_B$, respectively of the first serial resonance circuit 310 and the second serial resonance circuit 320 constituting the balun 118 are adjusted so as to satisfy the above formula (2).

Figure 6A:
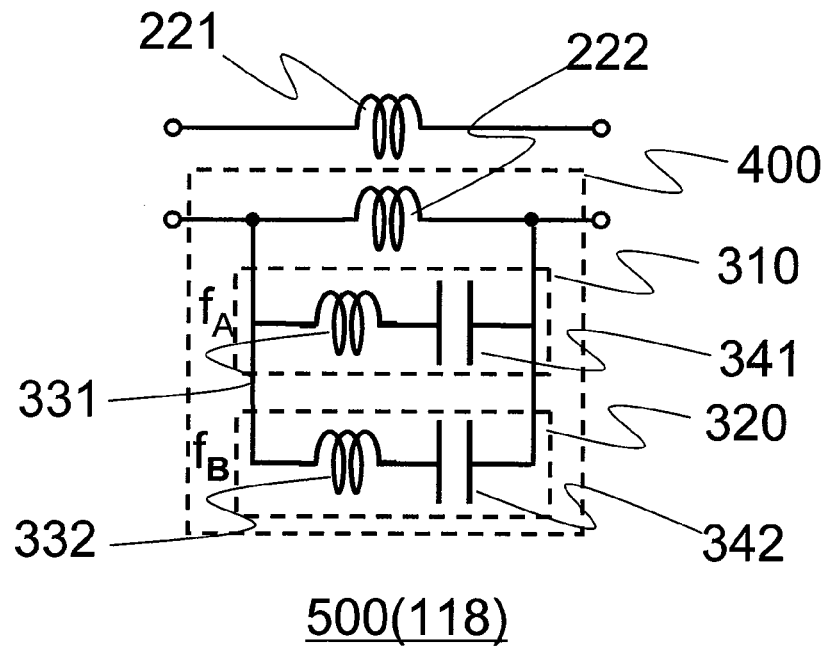
FIG. 6A is a circuit diagram for explaining an operation of a balun according to the present embodiment.

FIG. 6A is a simple circuit diagram 500 of the balun 118, where lumped elements (inductors) 221 and 222 represent the inductance of the center conductor 11 and the inductance of the shield 12 of the coaxial cable 10, respectively, for the sake of brevity. As illustrated, the center conductor 11 is represented by the inductor 221 having the inductance $L_S$ and the shield 12 is represented by the inductor 222 having the inductance $L_G$. As illustrated, the inductor 222, the first serial resonance circuit 310, and the second serial resonance circuit 320 constitute a parallel circuit 400 which is in series with respect to the shield 12 of the coaxial cable 10. In other words, the balun 118 of the present embodiment is represented as the parallel circuit 400 which is serially inserted in the shield 12 of the coaxial cable 10.

The resonance frequencies $f_A$ and $f_B$ of the respective serial resonance circuits 310 and 320 of the balun 118 according to the present embodiment are adjusted so as to satisfy the formula (2). Therefore, when the resonance frequency $f_{RN}$ is applied to the parallel circuit 400, the first serial resonance circuit 310 operates as an inductive reactance (inductor), and the second serial resonance circuit 320 operates as a capacitive reactance (capacitor).

Figure 6B:
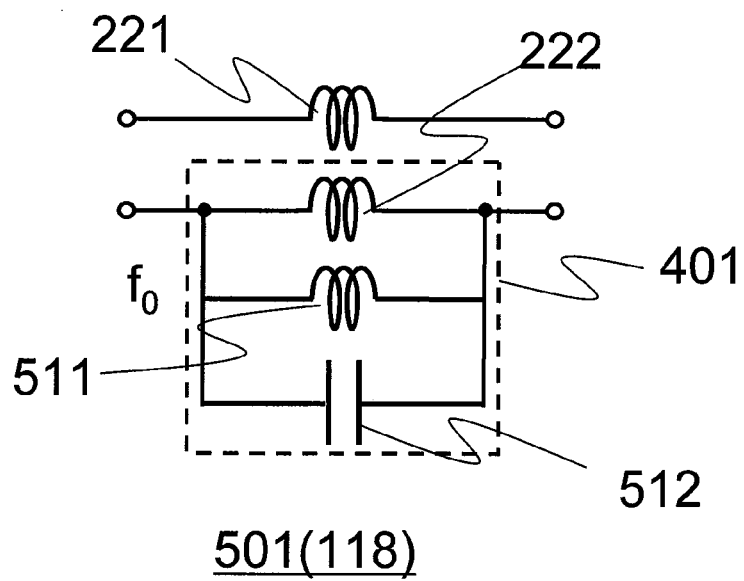
FIG. 6B is an equivalent circuit diagram in the case where the resonance frequency is applied for explaining an operation of a balun according to the present embodiment.

FIG. 6B is a circuit diagram 501 showing an equivalent circuit of the parallel circuit 400, in the case where the resonance frequency $f_{RN}$ is applied to the parallel circuit 400. Here, the first serial resonance circuit 310 is represented as the inductor 511, and the second serial resonance circuit 320 is represented as the capacitor 512. The inductance and the capacitance on this occasion are assumed as $L_A'$ and $C_A'$, respectively. As illustrated, the equivalent circuit 501 is represented as the parallel resonance circuit 401 in which the inductor 222, the inductor 511, and the capacitor 512 are connected in parallel.

In general, the parallel resonance circuit shows the maximum impedance at its resonance frequency. Therefore, the inductor 222, the inductor 511, and the capacitor 512 constituting the parallel resonance circuit 401 are adjusted in such a manner that the resonance frequency $f_{RN}$ of the parallel resonance circuit 401 becomes the nuclear magnetic resonance frequency $f_0$ of the measured nuclear species in the MRI apparatus 100 ($f_{RN}=f_0$). According to the adjustment as described above, the original parallel circuit 400 obtains the maximum impedance at the nuclear magnetic resonance frequency $f_0$ of the measured nuclear species. In other words, the balun 118 is able to give the maximum impedance for the common mode noise that is generated in the shield 12 at the time of measuring the nuclear species having the nuclear magnetic resonance frequency $f_0$.

The inductance $L_A'$ of the inductor 511 of the parallel resonance circuit 401 is expressed by the following formula (8) according to the formula (5). In addition, capacitance $C_B'$ of the capacitor 512 is expressed by the following formula (9) according to the formula (7).

$$L_A' = \frac{(f/f_A)^2 - 1}{(f/f_A)^2} L_A \qquad (8)$$

$$C_B' = \frac{C_B}{1 - (f/f_B)^2} \qquad (9)$$

Generally, there is a relationship as the following formula (10), between the resonance frequency $f_{RP}$ of the parallel resonance circuit made up of the inductor and the capacitor, and the inductance L of the inductor and the capacitance C of the capacitor.

$$f_{RP} = \frac{1}{2\pi\sqrt{LC}} \qquad (10)$$

Further in general, there is a relationship as the following formula (11), between the impedance $Z_{RP}$ of the parallel resonance circuit made up of the inductor and the capacitor, and the inductance L of the inductor and the capacitance C of the capacitor.

$$Z_{RP} = \frac{2\pi f L}{(2\pi f)^2 LC + 1} \qquad (11)$$

When the resonance frequency $f_{RN}$ of the parallel resonance circuit 401 is tuned to be the nuclear magnetic resonance frequency $f_0$ of the measured nuclear species, the resonance frequency $f_{RN}$, the inductance $L_G$ of the inductor 222 the shield 12, the inductance $L_A'$ of the inductor 511, and the capacitance $C_B'$ of the capacitor 512 satisfy the formula (10). Therefore, the relationship between the $f_{RN}(=f_0)$, and $L_G$, $L_A'$, and $C_B'$ are expressed by the following formula (12).

$$f_0 = f_{RN} = \frac{1}{2\pi}\sqrt{\frac{L_G^{-1} + L_A'^{-1}}{C_B'}} \qquad (12)$$

Furthermore, the impedance $Z_{RN}$ of the parallel resonance circuit 401, the inductance $L_G$ of the inductor 222 the shield 12, the inductance $L_A'$ of the inductor 511, and the capacitance $C_B'$ of the capacitor 512 satisfy the formula (11). Therefore, the relationship between $Z_{RN}$, and $L_G$, $L_A'$, and $C_B'$ are expressed by the following formula (13).

$$Z_{RN} = \frac{2\pi f L_G L_A'}{(2\pi f)^2 C_B' L_G L_A' + L_G + L_A'} \qquad (13)$$

Here, f represents a frequency of the voltage applied to the parallel resonance circuit 401.

As shown in the formula (12) above, the resonance frequency $f_{RN}$ becomes susceptible to the inductance $L_A'$ and the capacitance $C_B'$ in the case where $f_A$ and $f_B$ are set, respectively, to be a frequency higher than $f_{RN}$ and to be a frequency lower than $f_{RN}$. In the formula (12) for calculating the resonance frequency $f_{RN}$, when $f_A$ and $f_B$ are set to be close to $f_{RN}$, the inductance $L_A'$ and the capacitance $C_B'$ become dominant. Therefore, even when there is variation in the inductance $L_G$ of the shield 12 of the coaxial cable 10, the resonance frequency $f_{RN}$ remains almost unchanged.

The balun 118 of the present embodiment utilizes the feature above. In other words, as shown in the formula (2), the resonance frequencies $f_A$ and $f_B$ are adjusted in such a manner that the resonance frequency $f_{RN}$ (=$f_0$) of the parallel resonance circuit 401 (parallel circuit 400, balun 118) falls into the range between the resonance frequency $f_A$ of the first serial resonance circuit 310 and the resonance frequency $f_B$ of the second serial resonance circuit 320, whereby a variation feasible range of the resonance frequency $f_{RN}$ (=$f_0$) is determined.

Therefore, if $f_A$ and $f_B$ are determined considering the situation above, even in the case where unbalance of the characteristic impedance causes variation in the inductance $L_G$ of the inductor 222 which the coaxial cable 10 forms in the balun 118, there is little influence therefrom. Therefore, the resonance frequency $f_{RN}$(=$f_0$) of the balun 118 (the parallel circuit 400) hardly shifts from the tuned nuclear magnetic resonance frequency $f_0$ of the measured nuclear species.

Hereinafter, a specific example will be explained, in which each constitutional element is adjusted for deciding the resonance frequencies $f_A$ and $f_B$ so as to satisfy the formula (2).

A brief outline of the adjustment will be given as the following. Firstly, the inductance LG of the inductor 222 the shield 12 of the coaxial cable 10 will be determined. Then, by using the $L_G$ thus determined, according to the formulas (13), (8), (9), and (2), the inductance $L_A$ of the inductor 331, the capacitance $C_A$ of the capacitor 341, and the resonance frequency $f_A$ in the first serial resonance circuit 310, and the inductance $L_B$ of the inductor 332, the capacitance $C_B$ of the capacitor 342, and the resonance frequency $f_B$ in the second serial resonance circuit 320 are determined.

By way of example here, a specific adjustment of each value will be explained, in the case where a detection target is a hydrogen atomic nucleus having the nuclear magnetic resonance frequency 128 MHz in an MRI apparatus that has a static magnetic field intensity 3 T (tesla).

Firstly, the resonance frequency of the balun 118 according to the present embodiment is determined, i.e., the resonance frequency $f_{RN}$ (=$f_0$) of the parallel circuit 400 is determined. Here, it is assumed as 128 MHz.

Next, the inductance $L_G$ of the inductor 222 the shield 12 of the coaxial cable 10 is determined. Here, by way of example, the inductance is set to be 100 nH, which corresponds to the inductance of the inductor of the balun that is used for a typical 3 T MRI apparatus. It is to be noted that the magnitude of the inductance is not limited to this value. According to the formula (13), it is preferable that the value of $L_G$ is made large, in order to enlarge the impedance $Z_{RN}$ of the parallel circuit 400. However, since the magnitude of the impedance being required is different depending on the usage, it is determined as appropriate.

Next, the inductance $L_A$ and the capacitance $C_B$ are determined, respectively of the inductor 331 in the first serial resonance circuit 310 and of the capacitor 342 in the second serial resonance circuit 320. According to the formula (13), in order to enlarge the impedance $Z_{RN}$ of the parallel circuit 400 (parallel resonance circuit 401), it is preferable that a value of the inductance $L_A'$ of the inductor 511 is large. Similarly, in order to enlarge the impedance $Z_{RN}$ of the parallel circuit 400 (parallel resonance circuit 401), it is preferable that a value of the capacitance $C_B'$ of the capacitor 512 is small. In other words, according to the formula (8) and the formula (9), it is preferable that a value of the inductance $L_A$ of the inductor 331 is large, and a value of the capacitor $C_B$ of the capacitor 342 is small. However, when those elements are actually prepared, it is preferable to use elements being relatively easy in adjustment and small in loss. Therefore, the inductor having the inductance in the range from 10 nH to 200 nH, and the capacitor having the capacitance in the range from 1 pF to 100 pF are selected here. By way of example, it is assumed that the inductance $L_A$ of the inductor 331 is 200 nH and the capacitance $C_B$ of the capacitor 342 is 7 pF. It is to be noted that the range of the inductor 331 and the capacitor 342 are not limited to those described above. It is sufficient if those elements have values falling into a feasible range.

Next, the resonance frequency $f_A$ of the first resonance frequency circuit 310 and the resonance frequency $f_B$ of the second serial resonance circuit 320 are determined. If these frequencies are adjusted so as to satisfy the formula (2), the formula (13) is made true. Therefore, it is possible to reduce the shift of the resonance frequency of the balun 118 and provide high impedance, even in the case where unbalance occurs in the characteristic impedance of the coaxial cable 10 or a coupling occurs in the coaxial cable 10. Furthermore, considering a practical restriction of the MRI apparatus 100, in order to further reduce the shift of the resonance frequency of the balun 118, it is desirable that each of the resonance frequencies $f_A$ and $f_B$ is close to the nuclear magnetic resonance frequency $f_0$ of the measured nuclear species, according to the formula (12). Furthermore, in order to increase the impedance Z at the nuclear magnetic resonance frequency $f_0$, it is desirable that $f_A$ and $f_B$ are distant from $f_0$, according to the formula (13). On the basis of the description above, it is desirable that $f_0$, $f_A$, and $f_B$ satisfy the following formula (14) and formula (15), in order to produce an effect higher than a conventional method.

$$0.7f_0 < f_A < 0.95f_0 \tag{14}$$

$$1.05f_0 < f_B < 1.3f_0 \tag{15}$$

Therefore, each value is determined in such a manner that $f_A$ and $f_B$ obtained from the formulas (8), (9), and (12) satisfy the formulas (14) and (15). By way of example, if the value of $f_A$ falls into the range 102 MHz to 120 MHz, the formula (14) and the formula (15) are satisfied. In this example here, $f_A$ is assumed as 110 MHz within this range.

By using the resonance frequency $f_{RN}$ (128 MHz) of the balun 118 (parallel circuit 400), the inductance $L_A$ (200 nH) of the inductor 331, the capacitance $C_B$ (7 pH) of the capacitor 342, and the resonance frequency $f_A$ (110 MHz) of the first serial resonance circuit 310, which are determined as described above, the resonance frequency $f_B$ of the second serial resonance circuit 320, the capacitance $C_A$ of the capacitor 341, and the inductance $L_B$ of the inductor 332 are calculated according to the formulas (8), (9), and (12). In here, $f_B$=139 MHz, $C_A$=10.5 pF, $L_B$=186 nH are obtained.

As thus described, according to the adjustment that $L_G$=100 nH, $L_A$=200 nH, $C_A$=10 pF, $L_B$=190 nH, and $C_B$=7 pF, the balun 118 of the present embodiment establishes resonance at the nuclear magnetic resonance frequency 128 MHz of the hydrogen atomic nucleus in the 3 T MRI apparatus 100, and gives high impedance for the common mode noise. According to the balun 118 of the present embodiment, even when unbalance occurs in the characteristic impedance of the coaxial cable 10, the resonance frequency hardly shifts from an initial tuned value, and it is possible to the common mode noise with high precision. According to the present embodiment, it is possible to implement the balun 118 having such effect as described above, in a simple configuration and with the use of elements easily available. Therefore, this enables implementation of a low-cost and high-performance RF coil.

Hereinafter, a simulation result of the frequency characteristic will be described, in the case where influence (e.g., coupling) caused by unbalance of the characteristic impedance is exerted on each of the balun 118 of the present embodiment and the balun 20 of a conventional method. FIG. 7 illustrates the result of the simulation. The influence caused by the unbalance of the characteristic impedance may be equivalently represented by the change in the inductance $L_G$ of the inductor 222 according to the shield 12 of the coaxial cable 10 forming a loop. In the simulation, influence exerted by the unbalance of the characteristic impedance is simulated by varying the inductance $L_G$.

Figure 7A:
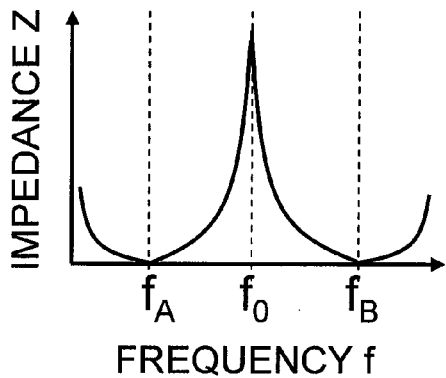
FIG. 7A illustrates a simulation result of the frequency characteristic of impedance of the balun according to the first embodiment.

FIG. 7A shows a frequency characteristic $f_{RN}$ of the impedance Z of the balun 118 in the case where the resonance frequency $f_{RN}$ of the balun 118 according to the present embodiment is tuned to the nuclear magnetic resonance frequency $f_0$ (=128 MHz) of hydrogen atomic nucleus in the 3 T MRI apparatus. It is assumed that the resonance frequency $f_A$ and the resonance frequency $f_B$ are adjusted to 110 MHz and 139 MHz, respectively.

Figure 7B:
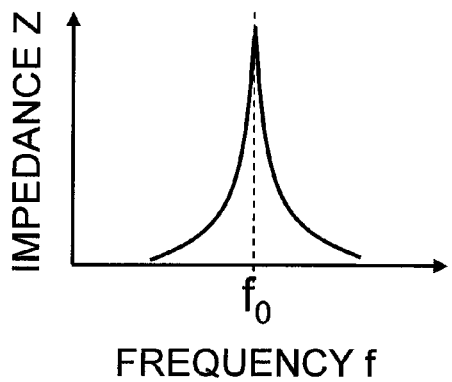
FIG. 7B illustrates a simulation result of the frequency characteristic of impedance of a conventional balun.

FIG. 7B shows a frequency characteristic of the impedance Z in the case where the resonance frequency $f_{RC}$ of the balun 20 according to a conventional method is tuned to the nuclear magnetic resonance frequency $f_0$ (=128 MHz) of hydrogen atomic nucleus in the 3 T MRI apparatus.

Figure 7C:
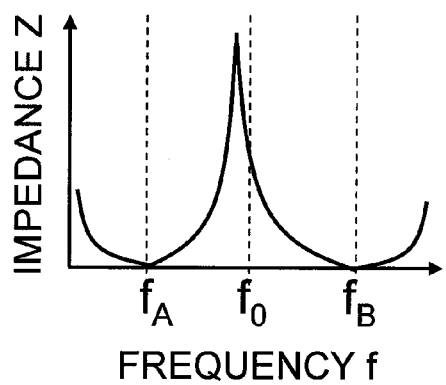
FIG. 7C illustrates a simulation result of the frequency characteristic of impedance of the balun according to the first embodiment.
Figure 7D:
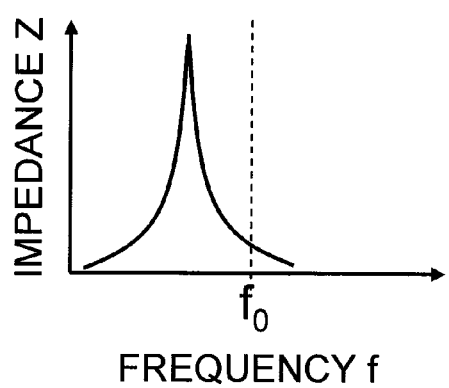
FIG. 7D illustrates a simulation result of the frequency characteristic of impedance of a conventional balun.

FIG. 7C and FIG. 7D show the frequency characteristics of the impedance Z in the case where the inductance $L_G$ of the coaxial cable 10 is increased by 10% due to the influence from the unbalance in the characteristic impedance, respectively in the balun 118 of the present embodiment, and in the balun 20 of the conventional method. As shown in FIG. 7C, in the balun 118 of the present embodiment, the resonance peak of the balun 118 shifts slightly (0.2 MHz) to a lower frequency. On the other hand as shown in FIG. 7D, in the balun 20 of the conventional method, the resonance peak of the balun 20 shifts significantly (6.0 MHz) to the lower frequency.

According to the result as described above, it is confirmed that when a value of the inductance $L_G$ is increased by 10%, the balun 118 of the present embodiment achieves a smaller resonance peak shifting amount, compared to the conventional balun 20, and it is able to maintain a large impedance at the nuclear magnetic resonance frequency $f_0$ of the measured nuclear species. In other words, it is further confirmed that the balun 118 of the present embodiment is less affected by the unbalance of the characteristic impedance, compared to the conventional balun 20.

Figure 7E:
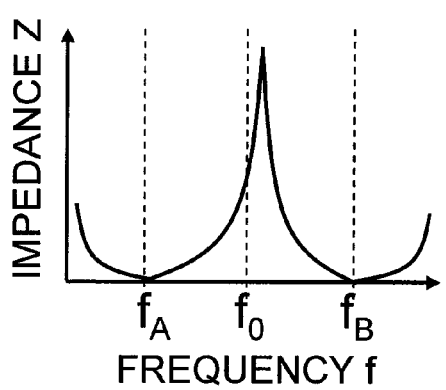
FIG. 7E illustrates a simulation result of the frequency characteristic of impedance of the balun according to the first embodiment.
Figure 7F:
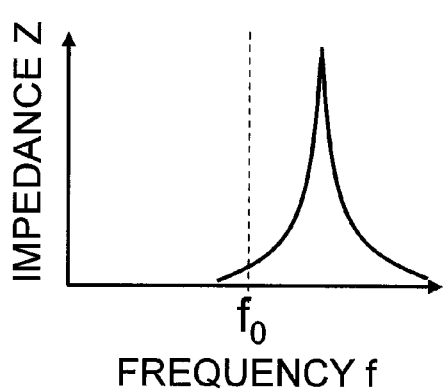
FIG. 7F illustrates a simulation result of the frequency characteristic of impedance of a conventional balun.

Similarly, FIG. 7E and FIG. 7F show the frequency characteristics of the impedance Z in the case where a value of the inductance $L_G$ of the coaxial cable 10 is decreased by 10% due to the influence from unbalance in the characteristic impedance, respectively in the balun 118 of the present embodiment, and in the balun 20 of the conventional method. As shown in FIG. 7E, in the balun 118 of the present embodiment, the resonance peak of balun 118 shifts slightly (0.2 MHz) to a higher frequency. On the other hand as shown in FIG. 7F, in the balun 20 of the conventional method, the resonance peak of the balun shifts significantly (6.9 MHz) to the higher frequency.

According to the result as described above, it is confirmed that when a value of the inductance $L_G$ is decreased by 10%, the balun 118 of the present embodiment achieves a smaller resonance peak shifting amount, compared to the conventional balun 20, and it is able to maintain a large impedance at the nuclear magnetic resonance frequency $f_0$ of the measured nuclear species. In other words, it is further confirmed that the balun 118 of the present embodiment is less affected by the unbalance of the characteristic impedance, compared to the conventional balun 20. In other words, it is determined that the resonance frequency $f_{RN}$ of the balun 118 of the present embodiment remains almost unchanged, even when unbalance occurs in the characteristic impedance of the coaxial cable 10.

Here, as described above, $L_A'$ and $C_B'$ are dominant in the formula (12) expressing the resonance frequency of the balun 118 of the present embodiment and also the formula (12) being a formula of computation for calculating $f_{RN}$. Therefore, it is obvious that the shift amount of resonance peak is significantly different between in the case where the value of the inductance $L_G$ as a constitutional element is changed in the balun 118 of the present embodiment and in the case where it is changed in the balun 20 of the conventional method.

As explained above, the balun 118 according to the present embodiment gives high impedance for the common mode noise at the tuned frequency $f_0$. In addition, the first serial resonance circuit 310 and the second serial resonance circuit 320 constituting the balun 118 are adjusted in such a manner that at least one of the resonance frequencies $f_A$ and $f_B$ of the respective circuits is lower than the frequency $f_0$, and the other frequency is higher than the frequency $f_0$. With this configuration, even when variation occurs for any reason in the inductance $L_G$ according to the coaxial cable 10 constituting the balun 118, there is almost no change in the resonance frequency $f_{RN}$ of the balun 118. Therefore, the balun 118 of the present embodiment is allowed to hold high impedance at the tuned frequency $f_0$. In other words, even in the case where unbalance occurs in the characteristic impedance of the coaxial cable 10 and any change occurs in the inductance $L_G$, the balun 118 of the present embodiment is able to provide high impedance for the common mode noise at the tuned frequency $f_0$. Therefore, according to the present embodiment, even when there is unbalance in the characteristic impedance of the coaxial cable 10, the common mode noise can be effectively d, thereby improving the performance of the RF coil.

As is obvious from the formula (12), the resonance frequency $f_{RN}$ of the balun 118 according to the present embodiment is hardly influenced by the inductance $L_G$ of the shield 12 of the coaxial cable 10 that is the most susceptible to external factors. Therefore, once the resonance frequency $f_{RN}$ of the balun 118 is tuned to be the nuclear magnetic resonance frequency $f_0$ of the measured nuclear species, there is almost no influence from the external factors, such as the coaxial cable 10 connected to the balun 118, a method of installation, and a positional relationship. Therefore, the balun 118 of the present embodiment is able to hold high impedance at the nuclear magnetic resonance frequency $f_0$ of the measured nuclear species. With the situation above, readjustment of the balun is not necessary, even when there is any change in the coaxial cable 10 connected to the balun 118, the method of installation, and the positional relationship. Therefore, it is possible to reduce the number of operation processes when the balun 118 is actually incorporated in the MRI apparatus 100.

Furthermore, according to the present embodiment, even when any unbalance occurs in the characteristic impedance of the coaxial cable 10 that forms the balun, it is possible to maintain high impedance, and therefore, there is no restriction in arranging the coaxial cable 10 that constitutes the balun 118, when the cable is used. In other words, it becomes unnecessary to make particular consideration to avoid unbalance in the characteristic impedance, and therefore flexibility is increased in using the cable.

As discussed above, since the balun 118 of the present embodiment is able to maintain high impedance at the nuclear magnetic resonance frequency $f_0$ of the measured nuclear species, it is possible to reduce the number of the baluns. In addition, as described above, even when unbalance occurs in the characteristic impedance of the coaxial cable 10 and any change occurs in the inductance $L_G$ of the shield 12 of the coaxial cable 10, it is possible to maintain high impedance. Therefore, unlike the balun 20 conventionally used, it is not necessary to connect the baluns 20 in series to combine impedance. Accordingly, it becomes possible to reduce the weight, volume, and cost of the apparatus.

In practical use, in order to prevent coupling with the RF coil, in some cases, the balun 118 uses the frequency $f_{RN}$ for blocking the common mode noise, intentionally shifting by a few MHz from the nuclear magnetic resonance frequency $f_0$ of the measured nuclear species. Even in such a case as described above, the use of the balun 118 of the present embodiment may prevent coincidence of resonance frequencies between the balun 118 and the RF coil due to the unexpected frequency shift of the balun 118. Therefore, improvement of the performance of the RF coil may be achieved.

In the present embodiment, an explanation has been made, taking as an example that the resonance frequency of the balun 118 is tuned to the nuclear magnetic resonance frequency of a hydrogen atomic nucleus in the 3 T MRI apparatus. However, the resonance frequency to which the adjustment is made is not limited to the above example. By way of example, the resonance frequency may be a nuclear magnetic resonance frequency of a hydrogen atomic nucleus in an MRI apparatus having the static magnetic field intensity of 1.5 T or 7 T. Alternatively, it may be a nuclear magnetic resonance frequency of fluorine, a carbon atomic nucleus, or the like.

As discussed above, the present embodiment relates to the balun used in the MRI apparatus, and it makes the resonance frequency thereof resistant to change in a simple configuration. Therefore, even in the case where unbalance occurs in the characteristic impedance of the coaxial cable connected to the balun, or the coaxial cable forming the balun, high impedance can be provided for the common mode noise of the nuclear magnetic resonance frequency $f_0$ of the measured nuclear species, and therefore the common mode noise can be d. Accordingly, it is possible to improve the performance of the RF coil.

It is to be noted that the shape of the balun 118 of the present embodiment is not limited to the shape as described above. It is only required that an electric circuit diagram of the balun is equivalent to the circuit diagram 500.

Figure 8A:
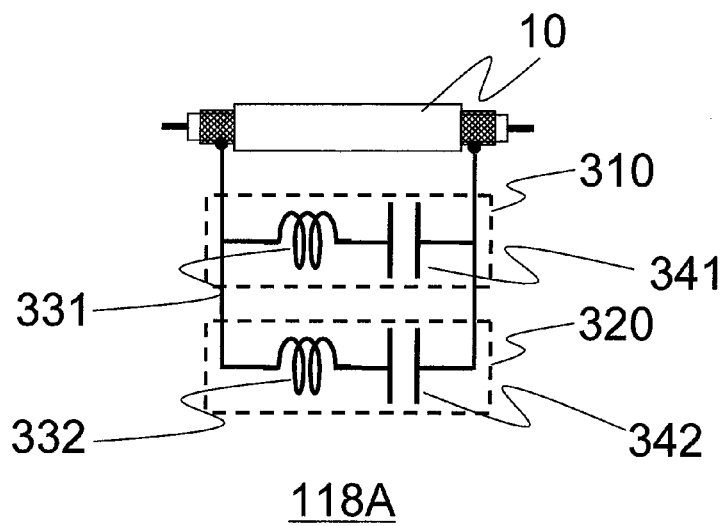
FIG. 8A is a schematic block diagram showing modification example of the first embodiment.

By way of example, the coaxial cable 10 of the balun 118 according to the present embodiment may have a linear shape. FIG. 8A shows a linear type balun 118A being a modification of the balun 118 according to the present embodiment. As illustrated, the linear type balun 118A has a shape that two serial resonance circuits 310 and 320 are connected in parallel with a linear coaxial cable 10, not particularly shaped. The configuration of the two serial resonance circuits 310 and 320 is the same as that of the balun 118.

Figure 8B:
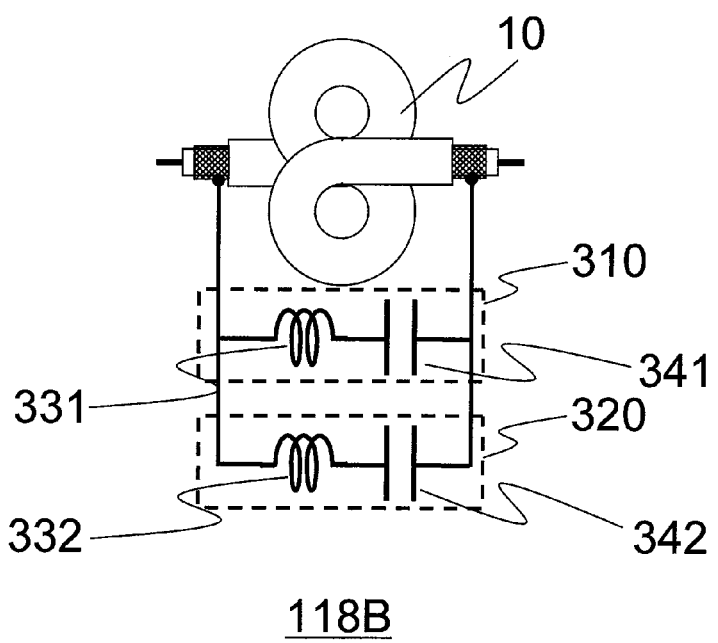
FIG. 8B is a schematic block diagram showing modification example of the first embodiment.

By way of example, the coaxial table 10 may have a shape of figure eight. FIG. 8B shows the figure-eight type balun 118B as a modification of the balun 118 of the present embodiment. As illustrated, the figure-eight type balun 118B has a shape that two serial resonance circuits 310 and 320 are connected in parallel with a coaxial cable 10 formed in a shape of figure eight. The configuration of the two serial resonance circuits 310 and 320 is the same as that of the balun 118.

The circuit configuration of the linear type balun 118A and the figure-eight type balun 118B may be represented by the circuit diagram 500 in the same manner as the aforementioned balun 118. Therefore, these balun 118A and balun 118B have the same circuit configuration and operation principle as the balun 118 of the present embodiment. Therefore, the linear type balun 118A and the figure-eight type balun 118B are able to provide high impedance for the common mode noise at the tuned frequency $f_0$, even in the case where unbalance occurs in the characteristic impedance of the coaxial cable 10. However, since the shape of the coaxial cable 10 is different from the aforementioned balun 118, a value of the inductance $L_S$ according to the inductor the center conductor 11 of the coaxial cable 10 and a value of the inductance $L_G$ according to the inductor the shield 12 thereof are changed. Therefore, $f_A$, $f_B$, $L_B$, and $C_A$ are determined depending on the value of the inductance $L_G$.

As described above, the linear type balun 118A and the figure-eight type balun 118B provide high impedance for the common mode noise of the tuned frequency $f_0$ (=$f_{RN}$). In addition, one of the resonance frequencies $f_A$ and $f_B$ of the respective two serial resonance circuits constituting the balun is set to be higher than the frequency $f_{RN}$ (=$f_0$) that is tuned to be the resonance frequency of the linear type balun 118A or the figure-eight type balun 118B, and the other frequency is set to be lower than $f_0$. Accordingly, even when a change occurs for any reason in the inductance $L_G$ the coaxial cable 10, $f_{RN}$ remains almost unchanged and therefore it becomes possible to operate only at the frequency being designed. Therefore, even in the case where there is unbalance in the characteristic impedance of the coaxial cable, it is possible to provide high impedance for the common mode noise of the tuned frequency $f_0$.

Furthermore, since the linear type balun 118A is linearly shaped, it is possible to form the balun in a space-saving manner, as shown in FIG. 8A. On the other hand, the figure-eight type balun 118B has a shape as shown in FIG. 8B and two loops generate magnetic fields oppositely directed to each other, thereby cancelling the magnetic fields generated from the coaxial cable 10 of the balun 118B. With the configuration above, it is possible to reduce magnetic turbulence, thereby enhancing the performance of the RF coil.

In the above embodiment and modification examples thereof, an explanation has been made taking as an example, the balun which is able to the common mode noise at one frequency. However, the number of frequency of the common mode noise is not limited to one, the noise being removable by the balun to which the present invention is applicable. By way of example, the balun may the common mode noise at two different frequencies (e.g., magnetic resonance frequencies of hydrogen and fluorine).

FIG. 9 shows as a modification of the balun 118 according to the present embodiment, a balun 118C which is able to the common mode noise at two different frequencies. As illustrated, in the balun 118C of the present modification example, a third serial resonance circuit 330, in which the inductor ($L_C$) 333 and the capacitor ($C_C$) 343 are serially connected, is connected to the second resonance circuit 320, in addition to the configuration of the balun 118 of the present embodiment.

The resonance frequencies ($f_A$, $f_B$, $f_C$) respectively of the first, the second, and the third serial resonance circuits 310, 320, and 330 are adjusted so that the balun 118C establishes resonance at a first and a second resonance frequencies ($f_1$, $f_2$)

in accordance with the magnetic resonance frequencies of the first and the second elements, and shows high impedance. Specifically, they are adjusted so as to satisfy the following formula (16).

$$f_A < f_1 < f_B < f_2 < f_C \tag{16}$$

Figure 9A:
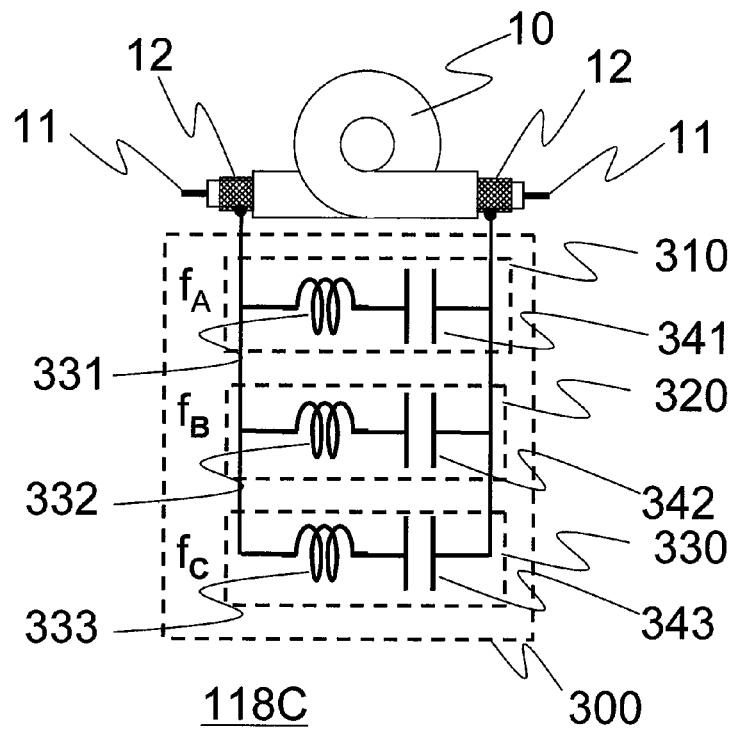
FIG. 9A is a circuit diagram for explaining an operation of the modification example of the balun according to the first embodiment.
Figure 9B:
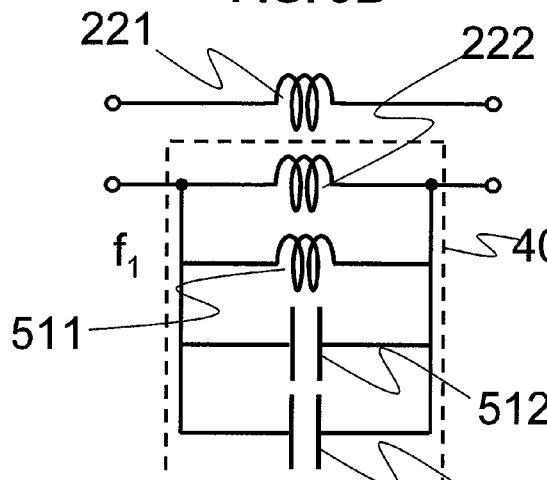
FIG. 9B is an equivalent circuit diagram in the case where a first resonance frequency is applied for explaining an operation of the modification example of the balun according to the first embodiment.
Figure 9C:
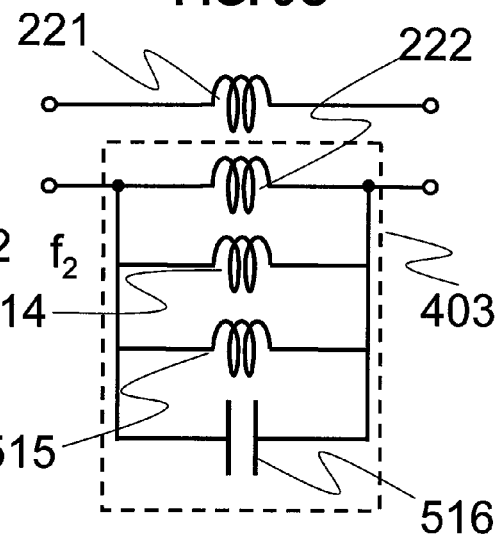
FIG. 9C is an equivalent circuit diagram in the case where a second resonance frequency is applied for explaining an operation of the modification example of the balun according to the first embodiment.

With reference to the circuit diagrams as shown in FIG. 9A, FIG. 9B, and FIG. 9C, an explanation will be made as to the operations and characteristics of the balun 118C according to the present modification example. As illustrated, the balun 118C is represented by the circuit in which serial resonance circuits are connected in parallel, where the serial resonance circuits 310, 320, and 330 incorporating the inductor and the capacitor, are connected in parallel. The resonance frequencies of the serial resonance circuit 310, 320, and 330 are $f_A$, $f_B$, and $f_C$, respectively.

Since the balun 118C of the present modification example is adjusted so as to satisfy the formula (16), when voltage of the first resonance frequency $f_1$ is applied, the first serial resonance circuit 310 operates as an inductive reactance, and it may be regarded as the inductor 511 ($L_A''$). Then, the second serial resonance circuit 320 and the third serial resonance circuit 330 operate as capacitive reactance, and it may be regarded as the capacitors 512 and 513 ($C_B''$, $C_C''$).

Therefore, at the first resonance frequency $f_1$, the balun 118C of the present modification example is represented as a parallel resonance circuit 402 in which the inductors 222 and 511, and the capacitors 512 and 513 as shown in FIG. 9B are connected each in parallel. On this occasion, when the resonance frequency $f_{RN1}$ of the parallel resonance circuit 402 is tuned to the first resonance frequency $f_1$, the balun 118C shows high impedance at the first resonance frequency $f_1$ and s the common mode noise. In addition, a relationship between the first resonance frequency $f_1$, and values $L_G$ and $L_A''$ of the inductors 222 and 511 and values $C_B''$ and $C_C''$ of the respective capacitors 512 and 513 constituting the parallel resonance circuit 402, is expressed as the following formula (17), according to the formula (10).

$$f_1 = f_{RN1} = \frac{1}{2\pi} \sqrt{\frac{L_G^{-1} + L_A''^{-1}}{(C_B'' + C_C'')}} \tag{17}$$

In addition, since the balun 118C of the present modification example is adjusted in such a manner that it satisfies the formula (16), when voltage of the second resonance frequency $f_2$ is applied, the first serial resonance circuit 310 and the second serial resonance circuit 320 operate as inductive reactance, and they may be regarded as the inductors 514 and 515 ($L_A''$, $L_B''$). Then, the third serial resonance circuit 330 operates as capacitive reactance, and it may be regarded as the capacitor 516 ($C_C''$).

Therefore, at the second resonance frequency $f_2$, the balun 118C of the present modification example is represented as the parallel resonance circuit 403 in which the inductors 222, 514 and 515, and the and the capacitor 516 are respectively connected in parallel as shown in FIG. 9C. Then, when the resonance frequency $f_{RN2}$ of the parallel resonance circuit 403 is tuned to the second resonance frequency $f_2$ and blocks the common mode noise. In addition, a relationship between the second resonance frequency $f_2$, and the values $L_G$, $L_A''$, and $L_B''$ of the inductors 222, 514, and 515 and the value $C_C''$ of the capacitor 516 each constituting the parallel resonance circuit 403, is expressed as the formula (18) according to the formula (10).

$$f_2 = f_{RN2} = \frac{1}{2\pi} \sqrt{\frac{L_G^{-1} + L_A''^{-1} + L_B''^{-1}}{C_C''}} \tag{18}$$

As thus described, the balun 118C of the present modification example adjusts $f_A$, $f_B$, and $f_C$, and values of each of the inductors and capacitors as constitutional elements so as to satisfy the formulas (16), (17), and (18), thereby establishing resonance at two elemental magnetic resonance frequencies ($f_1$, $f_2$) and showing high impedance. Therefore, the common mode noise at these magnetic resonance frequencies $f_1$ and $f_2$ can be d. In addition, an effect other than the number of the frequencies of the common mode noise that is removable, is the same as that of the balun 118 according to the present embodiment.

It is to be noted that in the present modification example, two different frequencies are assumed as magnetic resonance frequencies of hydrogen and fluorine, but the combination is not limited to those above. By way of example, a combination of fluorine and helium ($^3$He), a combination of phosphor ($^{31}$P) and lithium ($^7$Li), or the like, may be applicable. It is a matter of course that a combination of atomic nucleuses is not limited to those above.

In addition, another serial resonance circuit, in which the capacitor and the inductor are serially connected, is further connected in parallel with the third serial resonance circuit 330, thereby enabling removal of the common mode noise at three different frequencies. Theoretically, high-order synchronization is also possible.

Second Embodiment

Next, a second embodiment to which the present invention is applied will be explained. The MRI apparatus according to the present embodiment is basically the same as the first embodiment. In the present embodiment, the balun formation circuit in which two serial resonance circuits 310 and 320 are connected in parallel is inductively connected with the coaxial cable 10, magnetically by using magnetic coupling, instead of physically connecting therebetween directly. Hereinafter, an explanation will be made featuring a configuration that is different from the first embodiment.

FIG. 10A illustrates a shape of the balun 118-2 of the present embodiment. The balun formation circuit 300-2 of the present embodiment is provided with a first serial resonance circuit 310 and a second serial resonance circuit 320 being connected in parallel, and a conductor 350 which is connected in parallel with those circuits. As illustrated, unlike the first embodiment, the balun formation circuit 300-2, in which two serial resonance circuits 310 and 320 are connected in parallel, is not physically connected to the coaxial cable 10 directly. The balun 118-2 of the present embodiment makes the conductor 350 to adhere tightly to the shield 12 of the coaxial cable 10, and establishes magnetic coupling therebetween.

FIG. 10B is a circuit diagram 500-2 of the balun 118-2 according to the present embodiment, the inductance of the center conductor 11 and that of the shield 12 of the coaxial cable 10 are represented respectively by lumped elements (inductors) 221 and 222, and the inductance by the conductor 350 is represented by the lumped element (inductor) 351, thereby simplifying the balun. It is to be noted that the inductance of the inductor 221 is assumed as $L_S$, the inductance of the inductor 222 is assumed as $L_G$, in the same manner as the first embodiment, and the inductance of the inductor 351 is assumed as $L_C$.

Within the circuit diagram 500-2, magnetic coupling 990 occurs between the inductor 222 and the inductor 351, and therefore, inductive connection is established between the inductor 222 and the inductor 351 electromagnetically. Therefore, in the balun 118-2 of the present embodiment, the balun formation circuit 300-2 is not physically connected with the coaxial cable 10 directly via a conductor, but there is electromagnetic inductive connection therebetween. Therefore, an electrical equivalent circuit of the balun 118-2 of the present embodiment becomes equivalent to the circuit diagram 500. It is to be noted here that inductance $L_G$ of the inductor 222 has to consider mutual inductance, since a method of connection is different from the balun 118 of the first embodiment. In other words, considering the mutual inductance, the inductance $L_A$, $L_B$ and the capacitance $C_A$ and $C_B$ of each constitutional element are determined, so that high impedance can be obtained at the nuclear magnetic resonance frequency $f_0$ of a nuclear species being a detection target.

Accordingly, the balun 118-2 of the present embodiment is able to provide high impedance for the common mode noise at the nuclear magnetic resonance frequency $f_0$ of the measured nuclear species. In addition, either of the resonance frequency $f_A$ and the resonance frequency $f_B$ respectively of the first serial resonance circuit 310 and the second serial resonance circuit 320 constituting the balun 118-2, is set to be a frequency lower than the nuclear magnetic resonance frequency $f_0$, and the other is set to be a frequency higher than $f_0$. Therefore, even when any change occurs in the inductance $L_G$ according to the coaxial cable 10 for any reason, the resonance frequency $f_{RN}$ of the balun 118-2 of the present embodiment remains almost unchanged. Therefore, the balun 118-2 of the present embodiment is able to maintain an operation assuming the resonance frequency as the tuned frequency $f_0$. Therefore, even in the case where unbalance occurs in the characteristic impedance of the coaxial cable 10, it is possible to provide high impedance for the common mode noise at the tuned frequency $f_0$. Accordingly, the balun 118-2 of the present embodiment is able to provide the RF coil with high performance in the same manner as the first embodiment.

Furthermore, the balun 118-2 of the present embodiment does not require direct physical connection with the coaxial cable 10. Therefore, it is possible to achieve the same effect as produced by the aforementioned first embodiment, with a simpler configuration. In addition, since the direct physical connection is not required, a person who conducts the MRI scan is allowed to use the balun 118-2 as appropriate. Therefore, usage of the balun 118-2 becomes more flexible, thereby enabling a highly precise scan.

Figure 11:
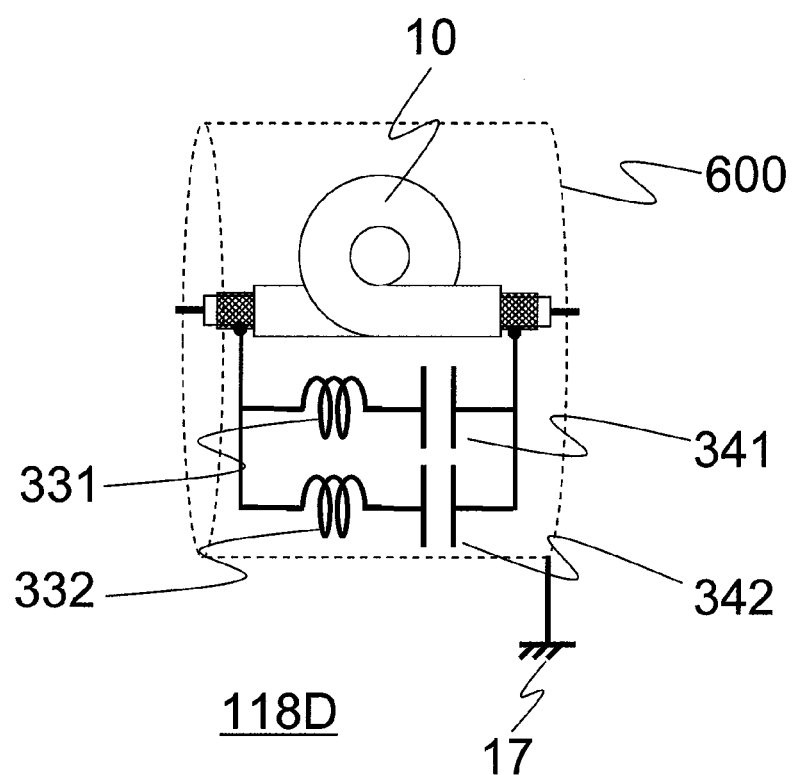
FIG. 11 is a schematic block diagram in which a radio shielding is mounted on the balun according to first embodiment.

In each of the aforementioned embodiments, it is further possible to use a radio shielding 600 to cover the balun together with the coaxial cable 10 forming the balun. FIG. 11 is an illustration for explaining an example (118D) in the case where the balun 118 of the first embodiment is covered with the radio shielding 600. As illustrated, the balun 118D is entirely covered with the radio shielding 600. Here, the radio shielding 600 is connected to the ground 17.

By covering the balun 118 of the first embodiment entirely by the radio shielding 600, even when a test subject or other cable comes closer to the balun 118D, it is possible to prevent magnetic coupling between such test subject or the cable, and the inductor within the balun 118D. The inductor within the balun 118D indicates an inductor the coaxial cable 10, the inductor 331 of the first serial resonance circuit 310, and the inductor 332 of the second resonance circuit 320.

Since it is possible to prevent magnetic coupling, the balun 118D covered with the radio shielding 600 is able to further reduce of the resonance frequency, compared to the balun 118 having the configuration of the first embodiment described above. Therefore, high impedance can be provided for the common mode noise at a desired nuclear magnetic resonance frequency, and even when unbalance occurs in the characteristic impedance of the coaxial cable 10, it is possible to maintain impedance being higher, with less shifting of resonance peak.

Furthermore, the magnetic turbulence generated in the coaxial cable 10 and in the inductors 331 and 332 may be reduced, and therefore influence on another balun and on the RF coil may be curbed. In other words, according to the present embodiment, it is possible to reduce influence applied from the outside, and further reduce a loss due to the magnetic coupling.

In each of the aforementioned embodiments, an explanation has been made as to the case where the measured nuclear species is one type (hydrogen atomic nucleus), and the balun according to any of the aforementioned embodiments or the modification example is used for the RF coil which acquires only the magnetic resonance signal at one frequency. However, this is not the only example. The balun according to any of the aforementioned embodiments or the modification example may employ a double-synchronous RF coil which is able to acquire magnetic resonance signals of two atomic nucleuses by only one RF coil. This is not the only example, however.

An explanation has been made taking the following as an example that a relationship among the resonance frequency $f_0$ of the balun, the resonance frequency $f_A$ of the first serial resonance circuit 310, and the resonance frequency $f_B$ of the second serial resonance circuit 320 are expressed by the formula (2). However, the resonance frequency $f_A$ and the resonance frequency $f_B$ may be vice versa. In other words, the configuration satisfying the following (19) is also applicable.

$$f_B < f_0 < f_A \qquad (19)$$

In other words, it is sufficient that frequencies of $f_A$, $f_B$, and $f_0$ are different from one another, and at least one of $f_A$ and $f_B$ has a frequency lower than $f_0$, and the other has a frequency higher than $f_0$.

In each of the aforementioned embodiments and the modification examples, an explanation has been made taking as an example that the balun formation circuit is provided with two serial resonance circuits having resonance frequencies different from each other. However, the circuit configuration of the balun formation circuit is not limited to this example. It is alternatively possible that the balun formation circuit is provided with two or more serial resonance circuits having at least two different types of resonance frequencies. For this case, the resonance frequency of each of the serial resonance circuits is adjusted so that the resonance frequency of the balun according to any of the aforementioned embodiments and modification example falls into the range between the resonance frequencies of the serial resonance circuits. In other words, as described above, when the resonance frequency $f_{RN}$ of the balun is tuned to the magnetic resonance frequency $f_0$ of the detection nuclear species, the resonance frequency of each of the serial resonance circuits is adjusted so that at least one of the resonance frequencies has a frequency lower than $f_0$ and at least one of the resonance frequencies has a frequency higher than $f_0$.

It is further possible to configure such that the balun according to any of the aforementioned embodiments and the modification examples is directly connected to a feeding point of the RF coil. With this configuration, the common mode noise flowing into the RF coil may be d with higher reliability. Then, the performance of the RF coil may be improved more.

In addition, the balun according to any of the aforementioned embodiments and the modification examples may be used together with a conventional balun 20. Using these baluns together enables provision of much higher impedance, thereby improving performance of the RF coil.

Alternatively, the balun according to any of the aforementioned embodiments and the modification examples may be employed in a multi-channel RF coil system. By using the balun in the multi-channel RF coil system, it is possible to prevent coupling between the baluns and shifting of resonance frequency of the balun due to the coupling between the balun and the coaxial cable 10. Therefore, even in the multi-channel RF coil system, it is possible to improve the performance of the RF coil, by using the balun according to any of the aforementioned embodiments and the modification examples.

In the aforementioned embodiments and the modification examples, there is shown an example that only one balun is placed between the RF power source 106 and the transmit RF coil 116, or between the receiver 108 and the receive RF coil 117, in the MRI apparatus 100. However, it is also possible to place two or more baluns.

In the aforementioned embodiments and the modification examples, an explanation has been made, taking as an example the case that the balun is formed by using a general coaxial cable 10 having the configuration as shown in FIG. 4. However, the coaxial cable being applicable is not limited to the aforementioned coaxial cable 10. By way of example, a coaxial cable referred to as "semi-rigid cable" may be employed, which employs a shield being a copper pipe with a small diameter. This is not the only example, as a matter of course.

DENOTATION OF REFERENCE NUMERALS

10: COAXIAL CABLE, 11: CENTER CONDUCTOR, 12: SHIELD, 13: DIELECTRIC, 15: SIGNAL SOURCE, 16: LOAD, 20: BALUN, 21: CIRCUIT DIAGRAM, 31: CAPACITOR, 32: INDUCTOR, 33: INDUCTOR, 34: PARALLEL RESONANCE CIRCUIT, 40: SERIAL RESONANCE CIRCUIT, 41: INDUCTOR, 42: CAPACITOR, 100: MRI APPARATUS, 101: MAGNET, 102: GRADIENT MAGNETIC FIELD COIL, 103: TEST SUBJECT, 104: SEQUENCER, 105: GRADIENT MAGNETIC FIELD POWER SOURCE, 106: RADIO FREQUENCY POWER SOURCE, 108: RECEIVER, 109: CALCULATOR, 110: DISPLAY, 111: STORAGE MEDIUM, 112: SHIM COIL, 116: TRANSMIT RF COIL, 117 RECEIVE RF COIL, 126: TRANSMIT-RECEIVE RF COIL, 127: TRANSMIT-RECEIVE CHANGEOVER SWITCH, 118: BALUN, 118-2: BALUN, 118A: BALUN, 118B: BALUN, 118C: BALUN, 118D: BALUN, 200: MRI APPARATUS, 201: MAGNET, 221: INDUCTOR, 222: INDUCTOR, 300: BALUN FORMATION CIRCUIT, 300-2: BALUN FORMATION CIRCUIT, 310: FIRST SERIAL RESONANCE CIRCUIT, 320: SECOND SERIAL RESONANCE CIRCUIT, 330: THIRD SERIAL RESONANCE CIRCUIT, 331: INDUCTOR, 332: INDUCTOR, 333: INDUCTOR, 341: CAPACITOR, 342: CAPACITOR, 343: CAPACITOR, 350: CONDUCTOR, 351: INDUCTOR, 400: PARALLEL CIRCUIT, 401: PARALLEL RESONANCE CIRCUIT, 402: PARALLEL RESONANCE CIRCUIT, 403: PARALLEL RESONANCE CIRCUIT, 500: CIRCUIT DIAGRAM, 500-2: CIRCUIT DIAGRAM, 501: EQUIVALENT CIRCUIT, 511: INDUCTOR, 512: CAPACITOR, 513: CAPACITOR, 514: INDUCTOR, 515: INDUCTOR, 516: CAPACITOR, 600: RADIO SHIELDING, 990: MAGNETIC COUPLING

What is claimed is:

1. A balun for blocking common mode noise flowing in a coaxial cable, comprising,
   a part of the coaxial cable, and
   a parallel circuit connected in parallel with a shield of the part of the coaxial cable, wherein,
   the parallel circuit comprises multiple serial resonance circuits each connected in parallel,
   each of the multiple serial resonance circuits comprises a capacitor and an inductor being connected in series, and resonance frequencies of the respective serial resonance circuits are adjustable by capacitance of the capacitor and by inductance of the inductor, and
   at least one of the resonance frequencies of the multiple serial resonance circuits is adjusted to be lower than a frequency at which the balun blocks the common mode noise, and at least one of the resonance frequencies is adjusted to be higher than the frequency at which the balun blocks the common mode noise.

2. The balun according to claim 1, wherein,
   the multiple serial resonance circuits are two circuits; a first serial resonance circuit and a second serial resonance circuit, and
   any one of a first resonance frequency being the resonance frequency of the first serial resonance circuit and a second resonance frequency being the resonance frequency of the second serial resonance circuit is adjusted to be lower than the frequency at which the balun blocks the common mode noise, and the other frequency is adjusted to be higher than the frequency at which the balun blocks the common mode noise.

3. The balun according to claim 2, wherein,
   a resonance frequency that is adjusted to be lower than the frequency at which the balun blocks the common mode noise, either of the first resonance frequency and the second resonance frequency, is adjusted to be a range from 70% to 95% of the frequency at which the balun blocks the common mode noise.

4. The balun according to claim 2, wherein,
   a resonance frequency that is adjusted to be higher than the frequency at which the balun blocks the common mode noise, either of the first resonance frequency and the second resonance frequency, is adjusted to be a range from 105% to 130% of the frequency at which the balun blocks the common mode noise.

5. The balun according to claim 1, wherein,
   the multiple serial resonance circuits are three circuits; a first serial resonance circuit, a second serial resonance circuit, and a third serial resonance circuit, and
   a resonance frequency $f_A$ of the first serial resonance circuit, a resonance frequency $f_B$ of the second serial resonance circuit, a resonance frequency $f_C$ of the third serial resonance circuit, a first resonance frequency $f_1$ at which the balun blocks the common mode noise, and a second resonance frequency $f_2(>f_1)$ at which the balun blocks the common mode noise are adjusted so that those frequencies satisfy a relationship of $f_A<f_1<f_B<f_2<f_C$.

6. The balun according to claim 1, wherein,
   the part of the coaxial cable has a loop shape.

7. The balun according to claim 1, wherein,
the part of the coaxial cable has a linear shape.

8. The balun according to claim 1, wherein,
the part of the coaxial cable has a figure-eight shape.

9. The balun according to claim 1, wherein,
the parallel circuit comprises a magnetic coupling means, and the parallel circuit is magnetically connected with the shield of the part of the coaxial cable.

10. The balun according to claim 1, wherein,
a radio shielding is applied on the part of the coaxial cable and the parallel circuit.

11. A magnetic resonance imaging apparatus, comprising,
a static magnetic field generator which generates a static magnetic field,
a gradient magnetic field generator which generates a gradient magnetic field,
an RF magnetic field generator which generates an RF magnetic field,
a transmit-receive coil which applies the RF magnetic field to a test subject and receives a magnetic resonance signal from the test subject,
a signal processor which processes the magnetic resonance signal received from the transmit-receive coil,
a transmit-receive switch which connects the RF magnetic field generator with the transmit-receive coil when the RF magnetic field is applied to the test subject and which connects the transmit-receive coil with the signal processor when the magnetic resonance signal received by the transmit-receive coil is processed, and
a controller which controls the gradient magnetic field generator, the RF magnetic field generator, and the signal processor, wherein,
the transmit-receive coil is connected with the transmit-receive switch via a coaxial cable, and
the coaxial cable comprises a balun, the balun is connected to the coaxial cable and comprises:
a parallel circuit connected in parallel with a shield of the part of the coaxial cable, wherein,
the parallel circuit comprises multiple serial resonance circuits each connected in parallel,
each of the multiple serial resonance circuits comprises a capacitor and an inductor being connected in series, and resonance frequencies of the respective serial resonance circuits are adjustable by capacitance of the capacitor and by inductance of the inductor, and
at least one of the resonance frequencies of the multiple serial resonance circuits is adjusted to be lower than a frequency at which the balun blocks the common mode noise, and at least one of the resonance frequencies is adjusted to be higher than the frequency at which the balun blocks the common mode noise.

12. A magnetic resonance imaging apparatus, comprising,
a static magnetic field generator which generates a static magnetic field,
a gradient magnetic field generator which generates a gradient magnetic field,
an RF magnetic field generator which generates an RF magnetic field,
a transmit coil which applies the RF magnetic field to a test subject,
a receive coil which receives a magnetic resonance signal from the test subject,
a signal processor which processes the magnetic resonance signal received from the receive coil, and
a controller which controls the gradient magnetic field generator, the RF magnetic field generator, and the signal processor, wherein,
the magnetic resonance imaging apparatus further comprising,
a first coaxial cable for transmitting the RF magnetic field formed by the RF magnetic field generator to the transmit coil, and
a second coaxial cable for transmitting the magnetic resonance signal received by the receive coil to the signal processor, wherein,
each of the first coaxial cable and the second coaxial cable comprises a balun, and
the balun is connected to each of the first coaxial cable and the second coaxial cable and comprises:
a parallel circuit connected in parallel with a shield of the part of the coaxial cable, wherein,
the parallel circuit comprises multiple serial resonance circuits each connected in parallel,
each of the multiple serial resonance circuits comprises a capacitor and an inductor being connected in series, and resonance frequencies of the respective serial resonance circuits are adjustable by capacitance of the capacitor and by inductance of the inductor, and
at least one of the resonance frequencies of the multiple serial resonance circuits is adjusted to be lower than a frequency at which the balun blocks the common mode noise, and at least one of the resonance frequencies is adjusted to be higher than the frequency at which the balun blocks the common mode noise.

13. The magnetic resonance imaging apparatus, according to claim 11, wherein,
the coaxial cable comprises the balun more than one.

14. The magnetic resonance imaging apparatus, according to claim 12, wherein,
at least one of the first coaxial cable and the second coaxial cable comprises the balun more than one.

* * * * *